United States Patent [19]

Tamura et al.

[11] Patent Number: 5,483,229
[45] Date of Patent: Jan. 9, 1996

[54] INPUT-OUTPUT UNIT

[75] Inventors: Hiroshi Tamura; Yoshiyuki Kamata; Mitsuaki Fujimori, all of Tokyo, Japan

[73] Assignee: Yokogawa Electric Corporation, Tokyo, Japan

[21] Appl. No.: 176,923

[22] Filed: Jan. 3, 1994

[30] Foreign Application Priority Data

Feb. 18, 1993 [JP] Japan .................................. 5-029236
Feb. 22, 1993 [JP] Japan .................................. 5-031824
Feb. 26, 1993 [JP] Japan .................................. 5-038021

[51] Int. Cl.$^6$ .................................................. G08B 23/00
[52] U.S. Cl. ........................... 340/693; 340/584; 439/61; 439/709; 361/788
[58] Field of Search ................................. 340/584, 654, 340/517, 825.49, 825.52; 361/785, 788; 307/151; 439/61, 709, 631; 395/325, 275, 399

[56] References Cited

U.S. PATENT DOCUMENTS

| | | | |
|---|---|---|---|
| 4,401,351 | 8/1983 | Record ..................................... | 439/61 |
| 4,511,950 | 4/1985 | Bunner et al. ........................... | 361/788 |
| 4,679,121 | 7/1987 | Schomers et al. ....................... | 361/785 |
| 4,872,212 | 10/1989 | Roos et al. .............................. | 361/788 |
| 5,103,378 | 4/1992 | Stowers et al. .......................... | 439/61 |
| 5,253,140 | 10/1993 | Inoue et al. ............................. | 439/709 |

*Primary Examiner*—John K. Peng
*Assistant Examiner*—Benjamin C. Lee
*Attorney, Agent, or Firm*—Moonray Kojima

[57] ABSTRACT

An input-output unit for communicating between an industrial control equipment and field devices controlled thereby, comprising a card accommodating chamber, provided with a row of slots which accommodate input-output cards which convert signals handled by the industrial control equipment and the signals handled by the field devices; a terminal block provided with two or three terminals per slot, to which signal wires connected to the field devices are connected and a case, on the front of which the card accommodating chamber and the terminal block are mounted in correspondence with the terminals and slots, whereby a compact input-output unit is realized with good heat dissipation, easy to assemble, and with increased density of mounting.

7 Claims, 20 Drawing Sheets

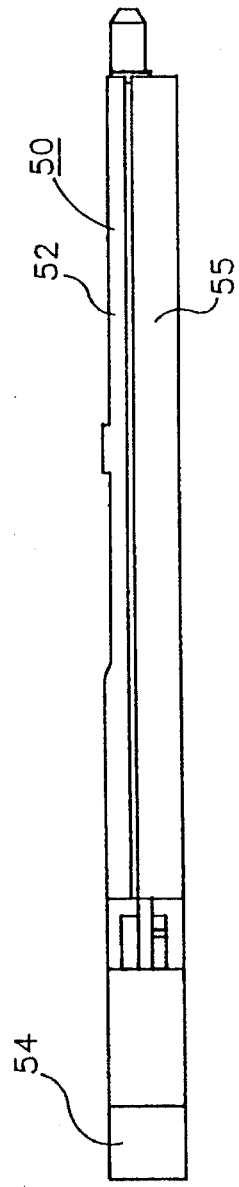
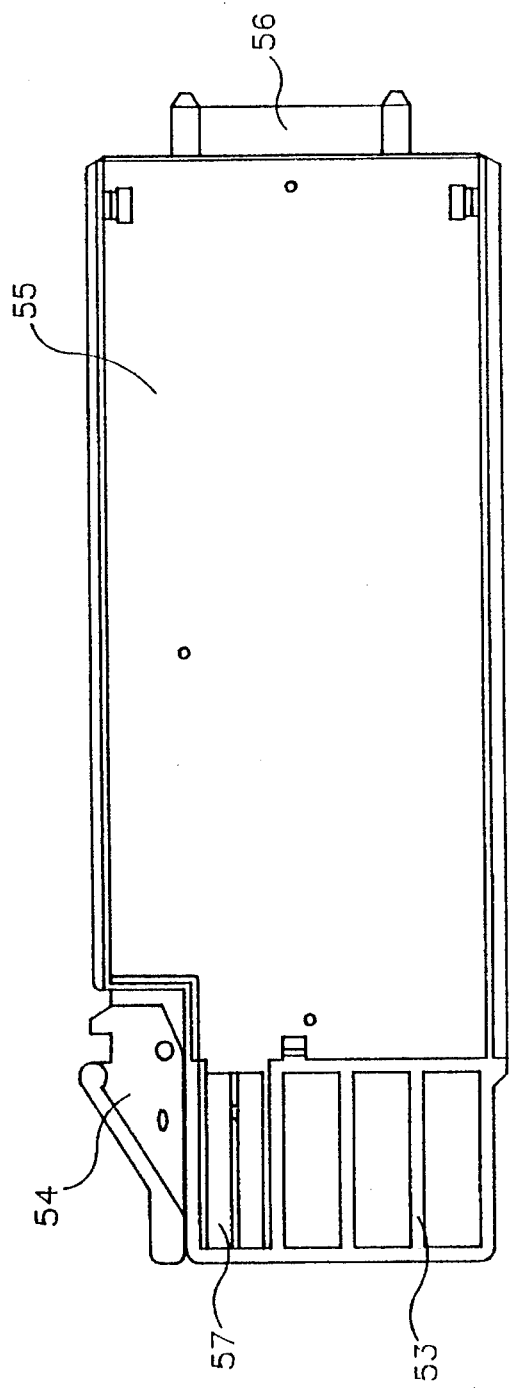
Fig.5(A)
Fig.5(B)

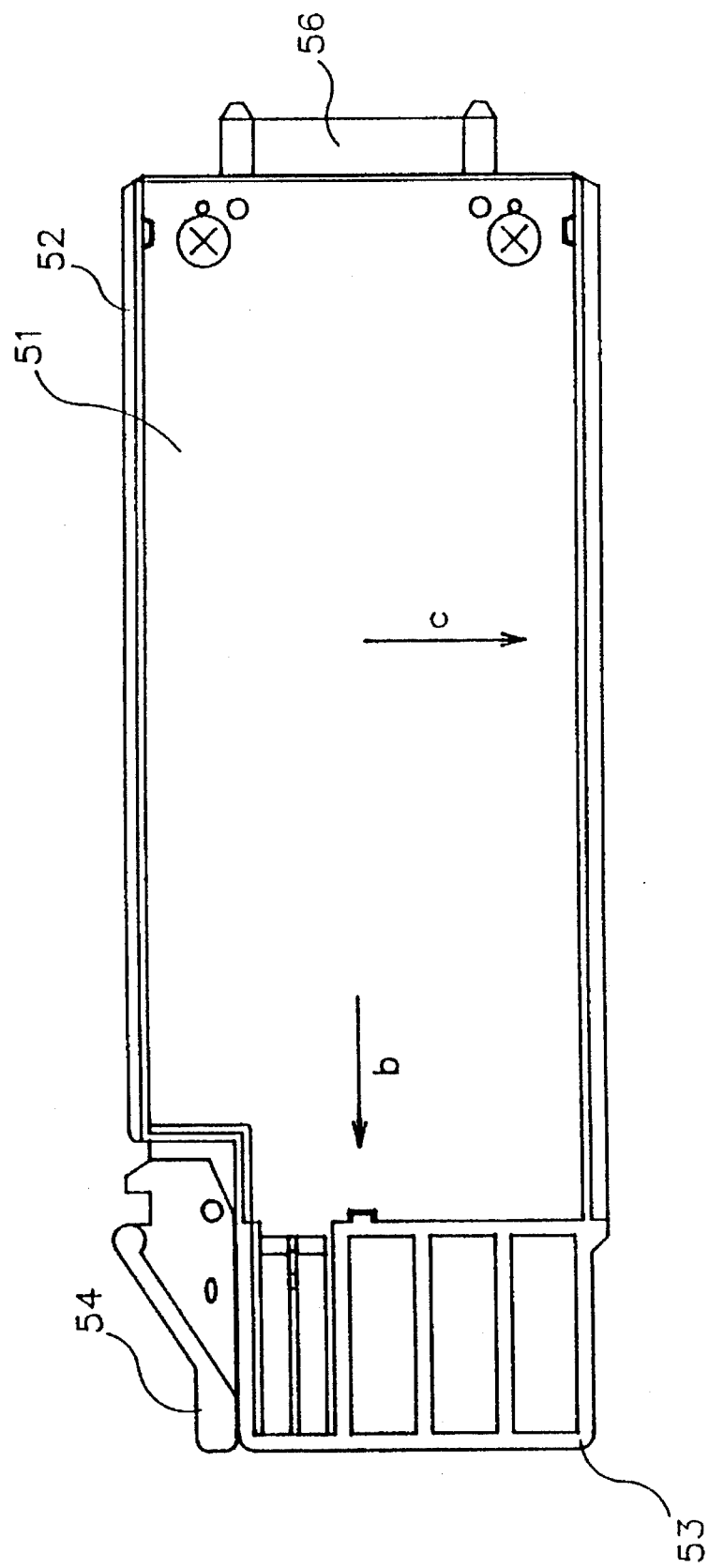

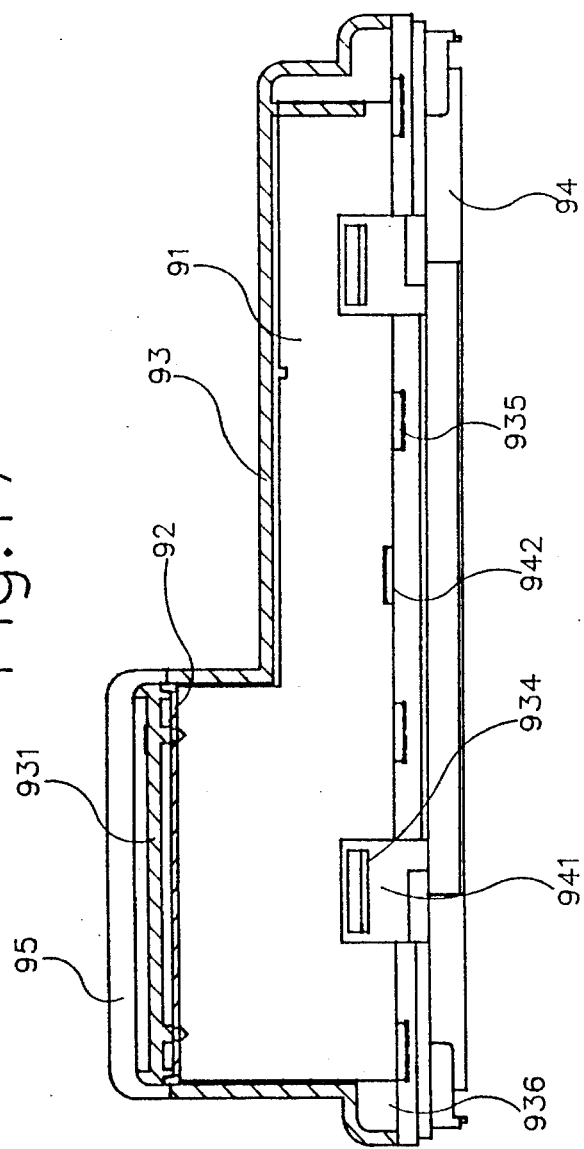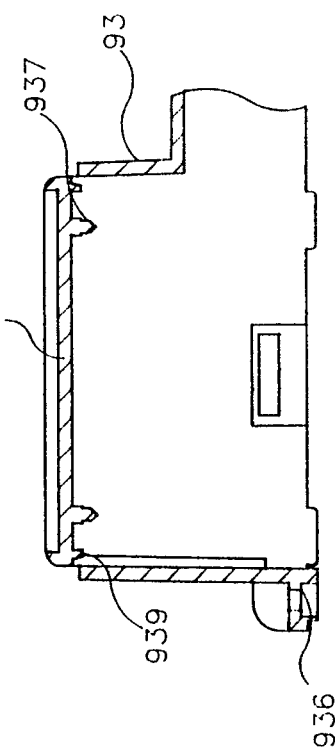

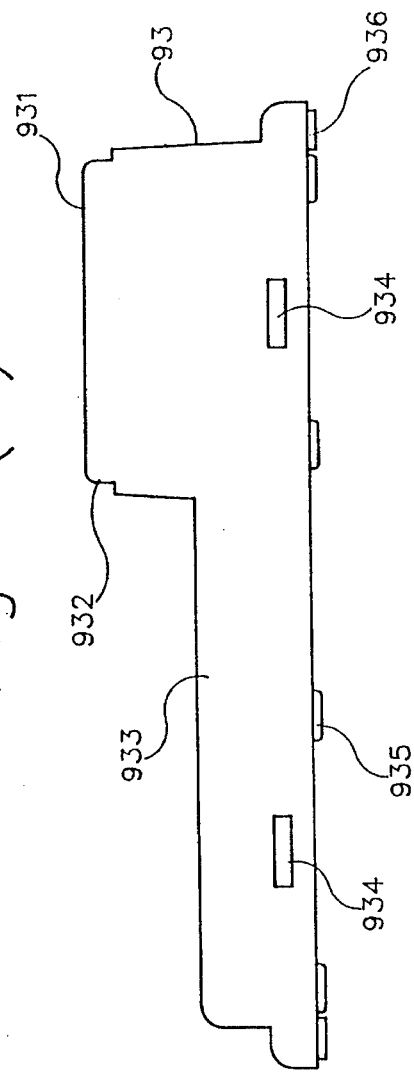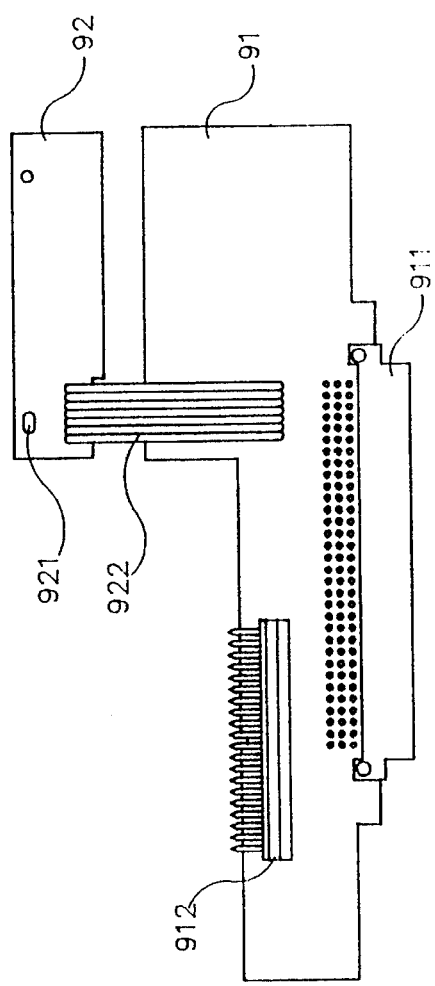

INPUT-OUTPUT UNIT

BACKGROUND OF THE INVENTION

1. Field of the Invention

This invention relates to an input-output unit for communicating between industrial control equipment and field devices, and more particularly, to improvements therein whereby such unit is easier to assemble, simplifies instrumentation operations, and enables the mounting thereof with increased density.

2. Description of the Prior Art

An input-output unit is housed in a box type body, such as disclosed in Japan Laid Open Patent No. H5-29777, and performs signal receiving and delivery for an industrial control system. The function of this kind of input-output unit are to receive signals from and to deliver signals to the detector terminals of flowmeters, pressure gauges, and the like, and the manipulating terminals of electric valves, and the like, and to connect them to higher control devices. In particular there are input-output units used for analog signals which use 4mA to 20 mA, etc., analog instrumentation signals, signals from thermocouples, and the like. Also, there are input-output units used for digital signals which handle ON and OFF signals, pulse string signals, and the like. A specific configuration is, for example, disclosed in Japan Laid Open UM No. H4-88093.

In the past, the number of signals that can be handled by one unit has been small and the input-output cards that are accommodated in the slots of an input-output unit have been relatively large. This is because of the low integration density of the ICs which comprise the electric circuits that perform signal conversion. As a result, the number of signal wires connected to one unit has also been small, and it has been easy to secure space for positioning terminal blocks. However, as the integration density of the ICs becomes higher the number of signals handled by one unit also increases, e.g., to 16 points, 32 points, 64 points, etc. But, when the number of input-output signals is simply increased, because a large number of signal wires have to be handled in a confined space, the wiring operation is time consuming and there is the danger of the wires being mistakenly connected to the wrong terminals.

To maintain certain input-output cards, it is necessary to remove them from the input-output unit, and the interruption of control in the control loop that accompanies the maintenance may adversely affect the system being controlled. For this reason, in the case of an input-output unit for control use, it is desirable that the control loops of each of the signals be handled by an independent input-output card, and that even when a certain card is being maintained, the other cards remain loaded in the unit and continue to control the loops. Thus, in input-output units for control use, a separate card is usually provided for each control loop. However, because the input-output card shape and dimensions are becoming smaller than they have been in the past, there arises the problem that when conventional loading and removal mechanisms are used, the number of loading and removal members becomes large and the loading and removal operations become awkward.

In some cases, an input-output unit performs relatively simple intermediary functions, such as display, warning signal receipt, and control. However, in the past, input-output units of different types have been used to handle analog signals and digital signals. In such cases, for the manufacturer, there is the problem that the number of components required increases and the managing of the parts becomes complex. Manufacturing thus becomes high number of parts, low volume type of manufacturing; hence, the benefits of mass-production are lost and costs become high. From the user's point of view, there is the problem that because the shapes and dimensions of the various input-output units are not necessarily standardized, when the units are to be accommodated in a container, the combinations of input-output units that can be installed together are limited, and the freedom with which the units can be selected, is limited.

When the outside signal wires are connected to an input-output unit of this kind, a terminal block is used. For example, an ON and OFF signal is assigned a terminal set comprising a plus terminal and a minus terminal. In the case of a thermocouple input, a circuit for performing cold junction compensation is provided. When a large number of signals are to be inputted, common minus terminals are sometimes used. However, there is the problem that when a different terminal block is designated for each purpose, the number of molds for the plastic molding increases and the initial investment in manufacturing equipment, increases.

When connectors are used for the connections to an input-output unit of this kind, an interface section equipped with a display is used. However, when display devices are mounted in the interface section, there is the problem that when light guides are used, the number of components increases and the assembly operation becomes complex.

SUMMARY OF THE INVENTION

Accordingly, a first object of the invention is to provide a compact input-output unit of which the wiring and assembly operations can be carried out smoothly even when a large number of signal wires are to be handled in a confined space.

A second object is to provide an input-output unit with which card loading and removal is relatively easy even in cases where a small card is provided for each control loop, such as in the case of an input-output card being used for control purposes.

A third object is to provide an input-output unit which can be manufactured at low cost based on using mass production techniques, and using a box type body to accommodate cards which can flexibly handle a wide range of different input-output signals.

A fourth object is to provide an input-output unit which can be manufactured at low cost using mass production methods and using a terminal block which can flexibly handle a wide range of different input-output signals.

A fifth object is to provide an input-output unit having an interface section, which is equipped with a display device, and which has a small number of components and is easy to assemble.

An aspect of the invention which achieves the first object is, in an input-output unit which performs signal receiving and delivery between an industrial control equipment and field devices being controlled thereby, the provision of the following: a card accommodating chamber 10 provided with a row of slots 12 which accommodate input-output cards 50 which perform signal conversion between signal forms handled by the industrial control equipment and the signal forms handled by the field devices; a terminal block part 20, provided with two or three terminals per slot, to which signal wires connected to the field devices are connected; and a case part 30, on the front of which the card accommodating chamber and the terminal block part are mounted with the terminals and the slots being in correspondence.

An aspect of the invention which achieves the second object is, in an input-output unit which performs signal receiving and delivery between an industrial control equipment and field devices being controlled thereby, the provision of input-output cards 50 which perform signal conversion between the signal forms handled by the industrial control equipment and the field devices and which each comprises: a printed circuit board 51, on which electronic components are mounted; a case part 52, to which the printed circuit board 51 is fitted in such a manner that the case part 52 covers one side of the printed circuit board 51; a fan part 53, mounted on the front side of case part 52, for air cooling; an ejector part 54, mounted on the end portion of the front side of the case part 52, which ejects the card from the card accommodating chamber 10; and a cover part 55, mounted on case 52 in such a manner as to cover the other side of printed circuit board 51.

An aspect of the invention which achieves the third object is, in an input-output unit which performs signal receiving and delivery between an industrial control equipment and field devices being controlled thereby, the provision of the following: an input-output nest 70, connected by a bus to the industrial control equipment; input-output printed circuit boards 80, which are accommodated in input-output nest 70 and which perform signal conversion between the signal form handled by the industrial control equipment and the signal form handled by the field devices; an interface section 90, mechanically mounted on the input-output nest 70, to which signal wires connected to the field devices are connected and which electrically connects these signal wires to the input-output cards.

In an aspect of the invention which achieves the fourth object, in a terminal block having a terminal block 60, in which a plurality of terminals to which signal wires are connected are disposed in rows, and a back board 62, which has a pattern which is connected to the terminals, mounted on the bottom surface of the terminal block 60, the terminal block has a ready indicator chamber 616 and a circuit board accommodating chamber 618 disposed in the row direction in which the terminals are disposed, and, in the ready indicating chamber light emitted by a light emitting device 626, mounted on the back board, for indicating the operating state of the terminal block, is guided to the upper surface of the terminal block, and, in cases when the signal state of the terminals of the terminal blocks is to be indicated, an indicator circuit board 64 on which light emitting devices 642, which are turned ON and OFF according to the signal states of the terminals, is accommodated in the circuit board accommodating chamber, and a partitioned light guide part 644 which constitutes the upper surface of the terminal block and which in the row direction in which the terminals are disposed separately displays the light emitted by each of the light emitting devices, is mounted in the circuit board accommodating chamber, and, in the case when the terminal block is for thermocouple input, a temperature compensation unit 66, which makes termal contact with terminals to which a thermocouple is connected and measures the temperature of the terminals, is mounted in the circuit board accommodating chamber.

In an aspect of the invention which achieves the fifth object, in a box type body for an electronic apparatus having a printed circuit board 91 and an indicator circuit board 92 which has light emitting devices mounted thereon and is connected to the printed circuit board through cable 922, a case 93 whose side surface is larger than the printed circuit board 91 and which accommodates the indicator circuit board 92 on the back of an indicator window 931 mounted at the front of case 93, and a cover 94 which is fitted to the back of case 93, the indicator circuit board 92 is provided with holding holes 921 and the indicator window 931 is provided with holding projections 937 which project from the back of indicator window 931 and engage with the holding holes 921 and the indicator circuit board 92 is held by the holding projections 937 and an edge portion of the printed circuit board 91.

BRIEF DESCRIPTION OF THE DRAWINGS

FIGS. 5(A), 5(B) and 5(C) are views depicting an input-output card 50.

FIG. 17 is a view depicting a connector type interface section.

FIG. 18 is an enlarged view depicting the vicinity of a display window 931.

FIGS. 19(A) and 19(B) are views depicting parts with cover 92 omitted.

DETAILED DESCRIPTION OF PREFERRED EMBODIMENTS

Figure 1A:
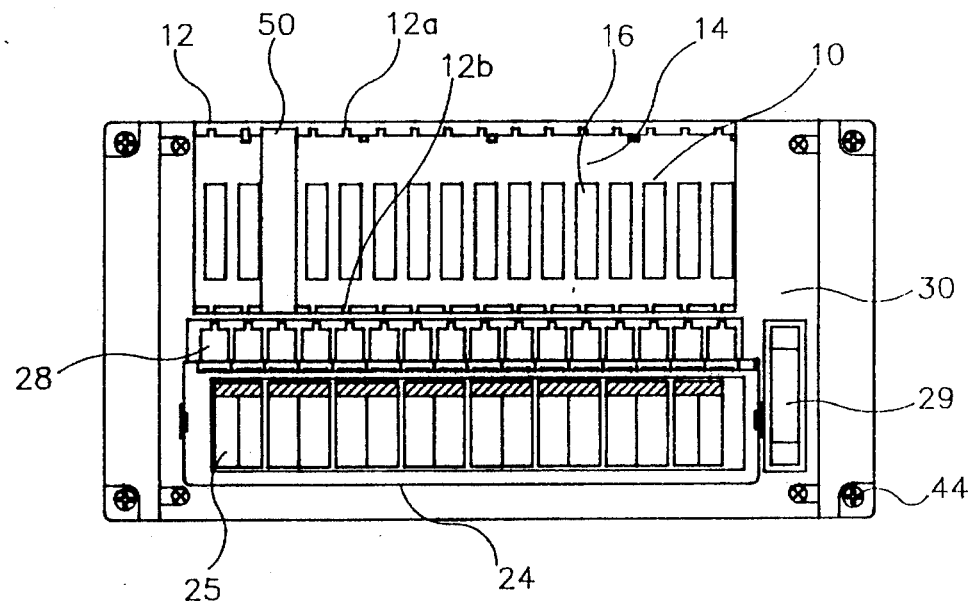
FIGS. 1(A), 1(B) and 1(C) are views depicting a first embodiment of the invention.
Figure 1B:
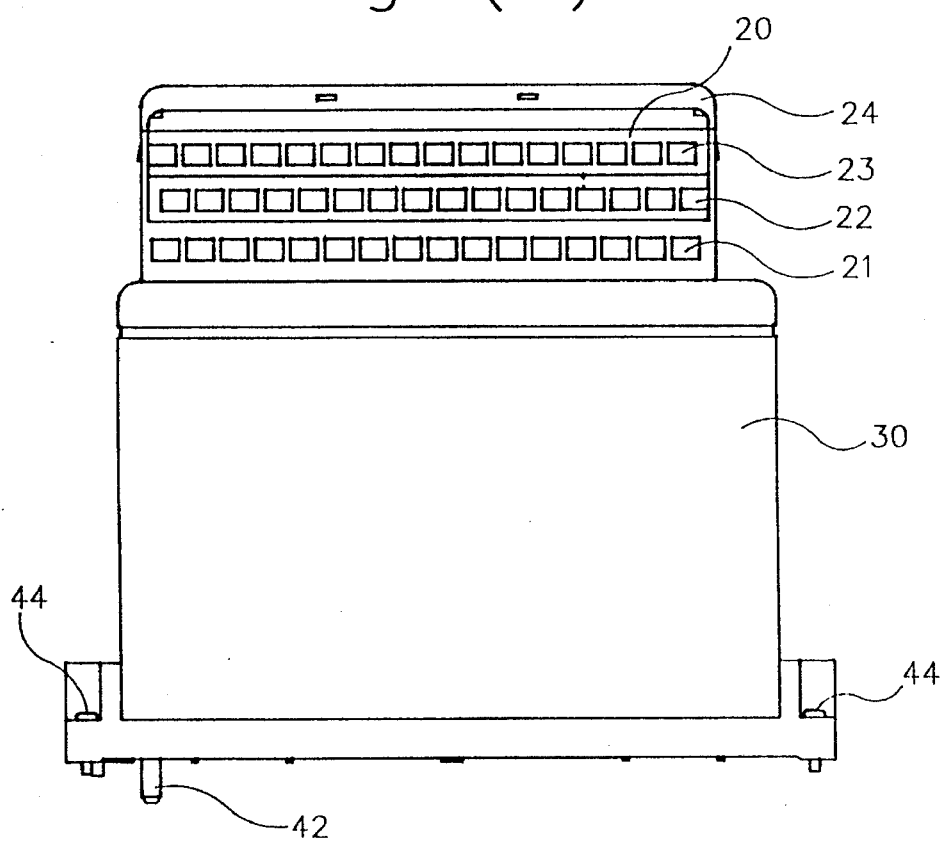
Figure 1C:
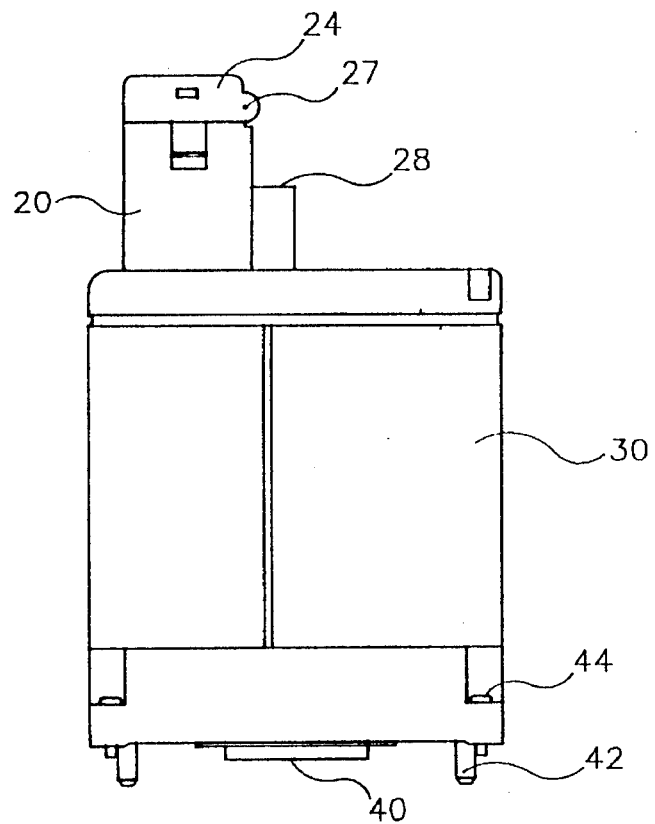

FIGS. 1(A), 1(B) and 1(C) depict the construction of the first embodiment, wherein FIG. 1(A) is a plan view, FIG. 1(B) is a front elevational view, and FIG. 1(C) is a side elevational view. A card accommodating chamber 10 is provided with a plurality of slots 12 for accommodating input-output cards 50. In this embodiment, there are 16 slots disposed in a row. An upper guide groove 12a and a lower groove 12b, oriented in the insertion direction of input-output cards 50, are disposed as a pair in each slot 12. A back board 14 is mounted at the back of card accommodating chamber 10, and connectors 16 are mounted on back board 14 in correspondence with slots 12. Connectors 16 connect with connectors 56 (see FIG. 5(B)) mounted on the back ends of input-output cards 50. Certain poles are connected to a terminal block part 20 and other poles are connected to a bus connected to the system side.

Terminal block part 20 has terminals in sets of two or three, and these sets of terminals correspond to the slots 12. In this embodiment, there are three terminals per set, a lower row terminal 21, a middle row terminal 22, and an upper row terminal 23. The middle row terminals 22 are offset by half their pitch with respect to the upper and lower row terminals 21,23 in order to facilitate connection of the field device signal wires. It is desirable that the terminals have mechanisms for preventing screws from falling out in order to make installation easier.

A terminal cover 24 covers lower row terminals 21, middle row terminals 22, and upper row terminals 23, and can be opened and closed about a shaft 27. When wire connection operation is carried out, cover 24 is opened. In the normal operating state cover 24 is closed in order to protect the terminals. Universal receiving chambers 28 are mounted on the card accommodating chamber side of terminal block part 20, and are used to mount RJC units for performing temperature compensation when the signal wires are thermocouples, and to connect backup apparatus when the control devices is in a semi-automatic state. A slot indicator sheet 25 and a terminal indicator sheet 26 (see FIG. 3) are affixed to the front side and the back side respectively of terminal cover 24. Details of sheets 25 and 26 will be described hereinbelow. A connector connecting part 29 is provided for handling the same signals as terminal block 20 or for handling other different signals. Connecting part 29 is also called a second output.

Figure 2:
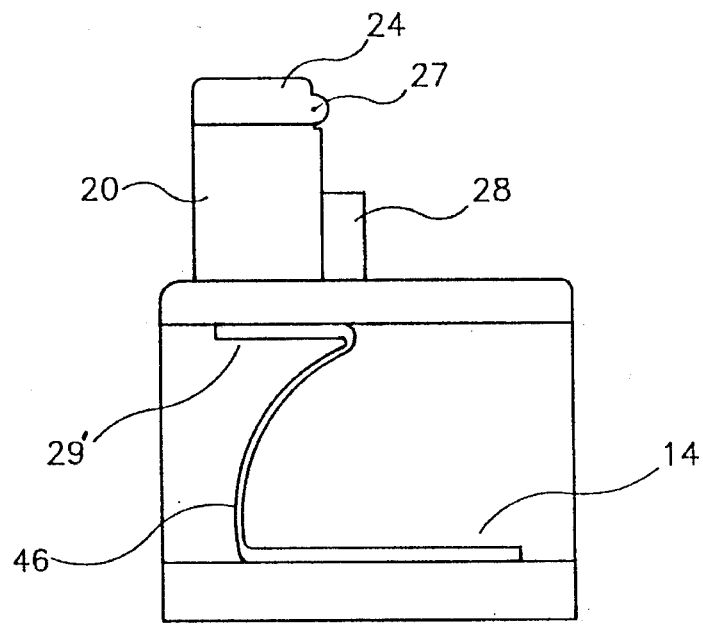
FIG. 2 is a view depicting the connection between a terminal block part 20 and a back board 14.

FIG. 2 shows the connection between terminal block part 20 and back board 14. It is necessary for each set of contacts of terminal block part 20 to be connected to the poles of connector 16, on back board 14, of the corresponding slot 12. If a terminal board 29' mounted on the back of terminal block part 20 can be connected en block to the terminals of back board 14, wiring operation is performed smoothly. In this embodiment, terminal board 29' and back board 14 are constructed integrally using a printed circuit board of a rigidity such that it can be bent, such as a flex-rigid circuit board 46, and the wiring patterns of both terminal board 29' and back board 14 are printed in advance on printed circuit board. However, there is no reason why terminal board 29' and back board 14 should not be constructed of separate printed circuit boards, and the two connected by a multiple core flexible cable.

Figure 3:
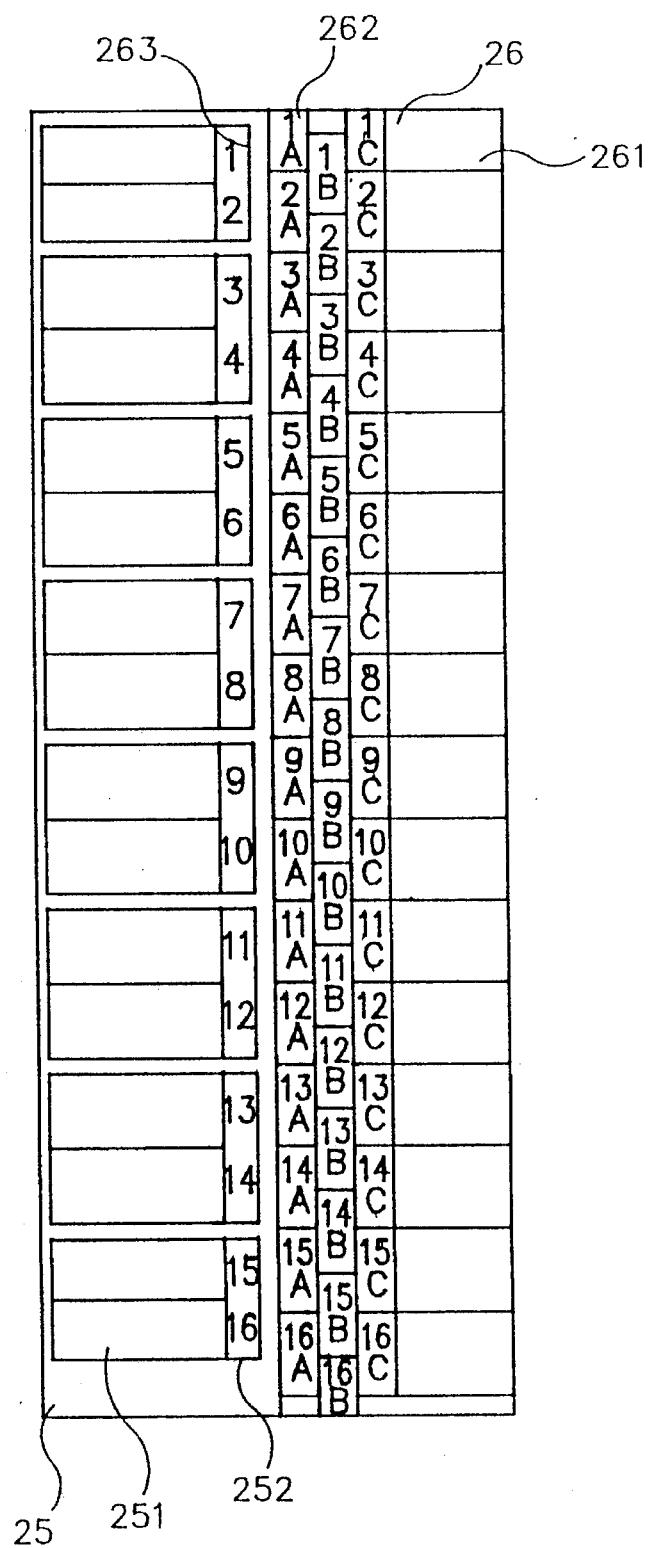
FIG. 3 is a view depicting a sheet that is affixed to a terminal cover 24.

FIG. 3 shows the sheet which is affixed to terminal cover 24. A slot indicator sheet 25 and a terminal indicator sheet 26 are printed on either side of a fold line 263, and the sheet is folded into two along fold line 263 and affixed to terminal cover 24 in such a way as to cover the front and rear sides of cover 24. Slot indicator sheet 25 comprises a tag indicator column 251 and a slot number column 252, and the tag names of input-output cards 50 inserted into slots 12, are written in tag indicator column 251. Terminal indicator sheet 26 comprises a tag indicator column 261 and a terminal number column 262, and the tag names of the field devices connected to the input-output unit are written in tag indicator column 261. Lower row terminals 21, middle row terminals 22, and upper row terminals 23 of terminal block part 20 are indicated in terminal number column 262. The terminals of slot one are, for example, marked 1A, 1B, 1C. In the field of instrumentation, a "tag number" is a name given to each object of control in order to distinguish the objects of control.

Figure 4A:
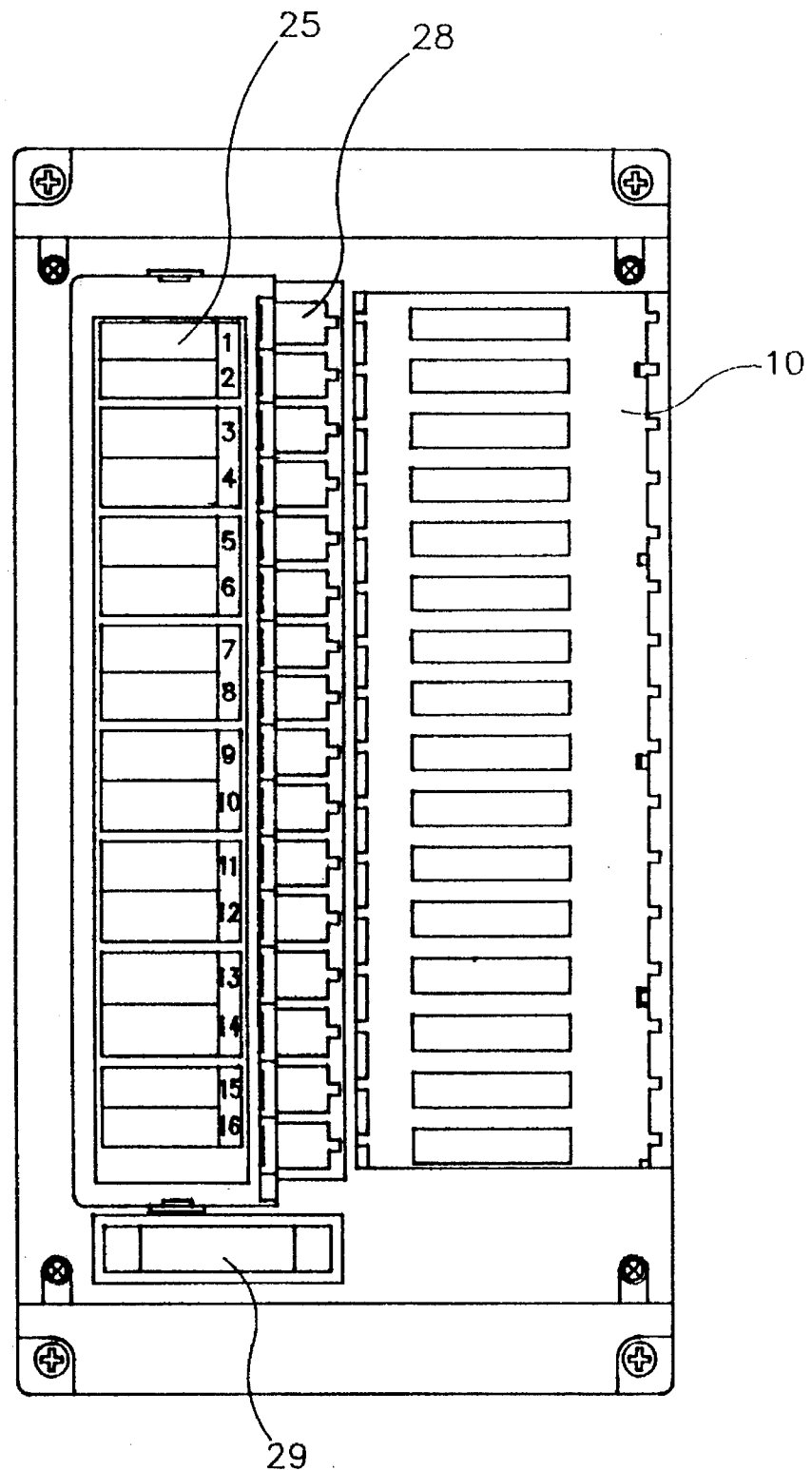
FIGS. 4(A) and 4(B) are views depicting the way in which the sheet shown in FIG. 3 is affixed to terminal cover 24.
Figure 4B:
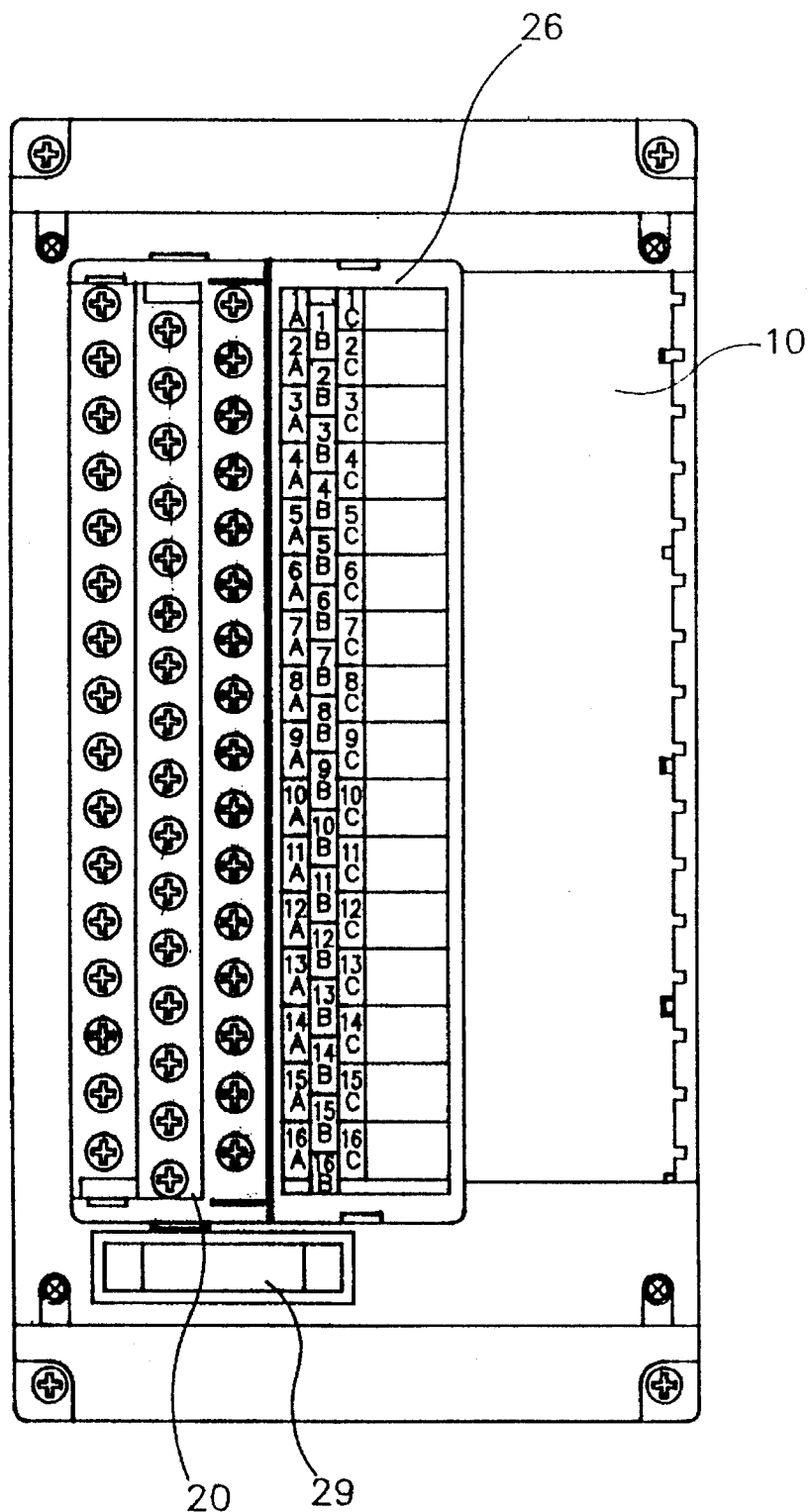

FIGS. 4(A) and 4(B) show the sheet affixed to terminal cover 24, wherein FIG. 4(A) shows the terminal cover being closed, and FIG. 4(B) shows the terminal being open. When terminal cover 24 is closed slot indicator sheet 25 can be seen. It is with the terminal cover being closed that input-output cards 50 are inserted into their respective slots 12, and the principle is that the tag name column 251 and the tag names on the input-output cards 50 should match. In this manner, even when an input-output card 50 is pulled out of its slot 12 for maintenance, or the like, the tag of the object of maintenance can be discerned by reference to the tag indicator column 251. Thus, there is the benefit that it is not necessary to refer to the input-output card 50 each time the tag needs confirming, and maintenance can be carried out smoothly.

When terminal cover 24 is open, terminal indicator sheet 26 can be seen. In this position, terminal indicator sheet 26 is alongside the sets of terminals of terminal block part 20. Thus, during instrumentation operation, terminal number column 262 is close to the screw terminals, and confirmation of the terminal number is easy. Also, after wiring has been completed, start up is carried out, and, during such start up, checking of the screw terminals and numbers can be carried out easily, and checking can be performed even when input-output cards 50 are not loaded into their respective slots 12.

Input-Output Card 50

FIGS. 5(A), 5(B) and 5(C) show an input-output card 50 which is used in the first embodiment, wherein FIG. 5(A) is a plan view, FIG. 5(B) is a side elevational view with cover 55 being fitted, and FIG. 5(C) is a side elevational view with cover 55 being removed. Printed circuit board 51 has electronic components, which perform signal conversion, mounted thereon, and is made to be thin, for example, by surface mounted components being mounted on both sides thereof. A case part 52 gives the input-output card 50 its basic shape, and printed circuit board 51 is mounted on case part 52 and case part 52 protects one side of printed circuit board 51. A fan part 53 is used to cool the device, and preferably is made integrally with case part 52 from die cast aluminum, or the like, so that fan part 53 can conduct heat smoothly. An ejector portion 54 is mounted on the end of the front of case part 52, and is used when card 50 is taken out of card accommodation chamber 10. A cover 55 protects the other side of printed circuit board 51, and is fitted to case part 52. A connector 56 is mounted on the back of input-output card 50, and is mated with a connector 16. A light guide part 57 is mounted on fan part 53, and guides light emitted by light emitting device 58 (see FIG. 7), which is mounted on the printed circuit board 51 and indicates the operating state of the input-output card 50, to the front of the input-output card 50.

The device is assembled in the following manner. First, ejector part 54 is mounted on case part 52. Then, light guide part 57 is inserted into a fitting groove formed in fan part 53. Printed circuit board 51 is then positioned in its predetermined position in case 52 and fixed in place with screws. Positioning of the parts is carried out smoothly by moving the printed circuit board in the directions shown by arrows b and c in FIG. 5(C). Finally, cover part 55 is fitted to case part 52. When desired, a name plate showing a tag may be affixed to the front of case part 52.

In this manner, because printed circuit board 51 is entirely covered by case part 52 and cover part 55, there is the benefit that there are no exposed electronic components and reliability is good. For example, even if an electrically conductive material touches the device, there is no danger of shorting of the electronic components. Also, during the handling, no outside forces can act directly on the parts. Although input-output card 50 is accommodated in card accommodating chamber 10, because fan part 53 is exposed to the outside ambient, there is the benefit that heat generated in printed circuit board 51 is conducted by case part 52 and cover part 55 to fan part 53 and is released into the outside air. Thus, heat dissipation efficiency is good.

Figure 6A:
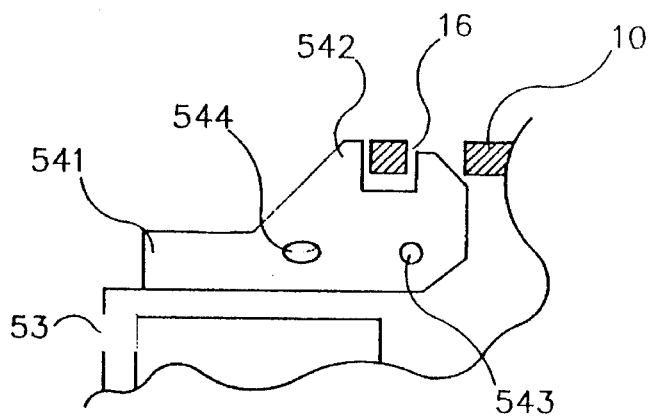
FIGS. 6(A) and 6(B) are views depicting an ejector part 54.
Figure 6B:
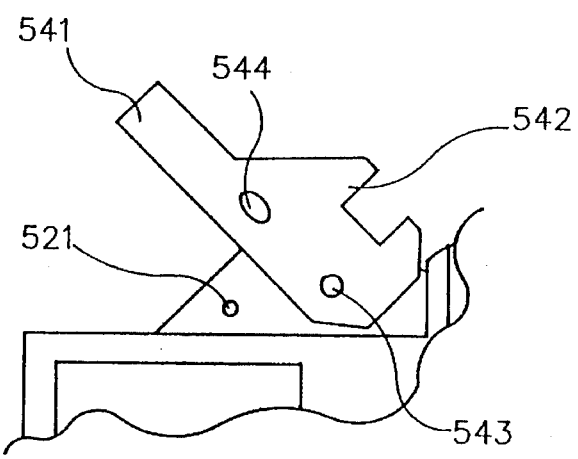

FIGS. 6(A) and 6(B) show ejector part 54 comprising a lever portion 541, which provides an ejecting force; an engaging portion 542 having a recessed portion which engages with a window portion 16 formed in card accommodation chamber 10, a shaft portion 543 which serves as a pivot point, and a lock portion 544 which fixes the ejector part 54 to case part 52. Lock portion 544 is a concave portion which engages with a convex portion 521 mounted on the side of case part 52. In this manner, by the provision of lock portion 544, because ejector part 54 is restrained in a position in which it holds the input-output card 50 in the state in which it is mated with connector 16, there is the benefit that the input-output card 50 is prevented from accidently slipping out of connector 16 as a result of vibrations or the like. Thus, reliability is increased.

Figure 7:
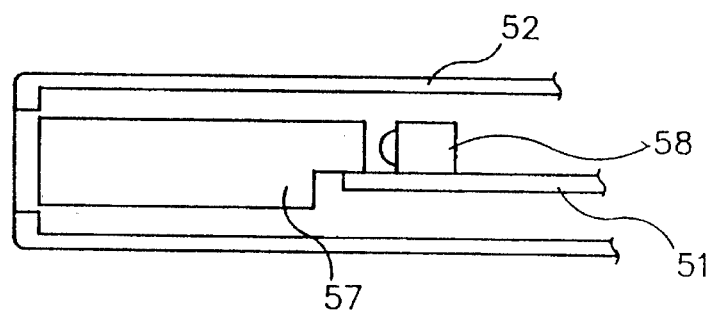
FIG. 7 is a view depicting a device which indicates the operating state of an input-output card 50.

FIG. 7 shows the operating state of card 50. Light emitting device 58 is mounted on printed circuit board 51. Light from device 58 is guided to the front of the card by light guide part 57. Conventionally, as disclosed in Japan Laid Open Patent H3-1579, a light emitting device of a special shape was used. However, in this embodiment, light guide 57 is used. Thus, there is the benefit that relatively few components are required and the device can be easily assembled.

According to the first embodiment, because the heat generated in card 50 is efficiently dissipated by part 30, there is the benefit that satisfactory heat dissipation can be achieved even with a small box type body. Also, because no terminal blocks are mounted on cards 50, and the signal wires are connected to specially mounted terminal block part 20, cards 50 are connected to connectors at the back board 14 side, there is the benefit that little positioning of wires is required and the wiring and assembly can be carried out smoothly.

Second Embodiment

Figure 8:
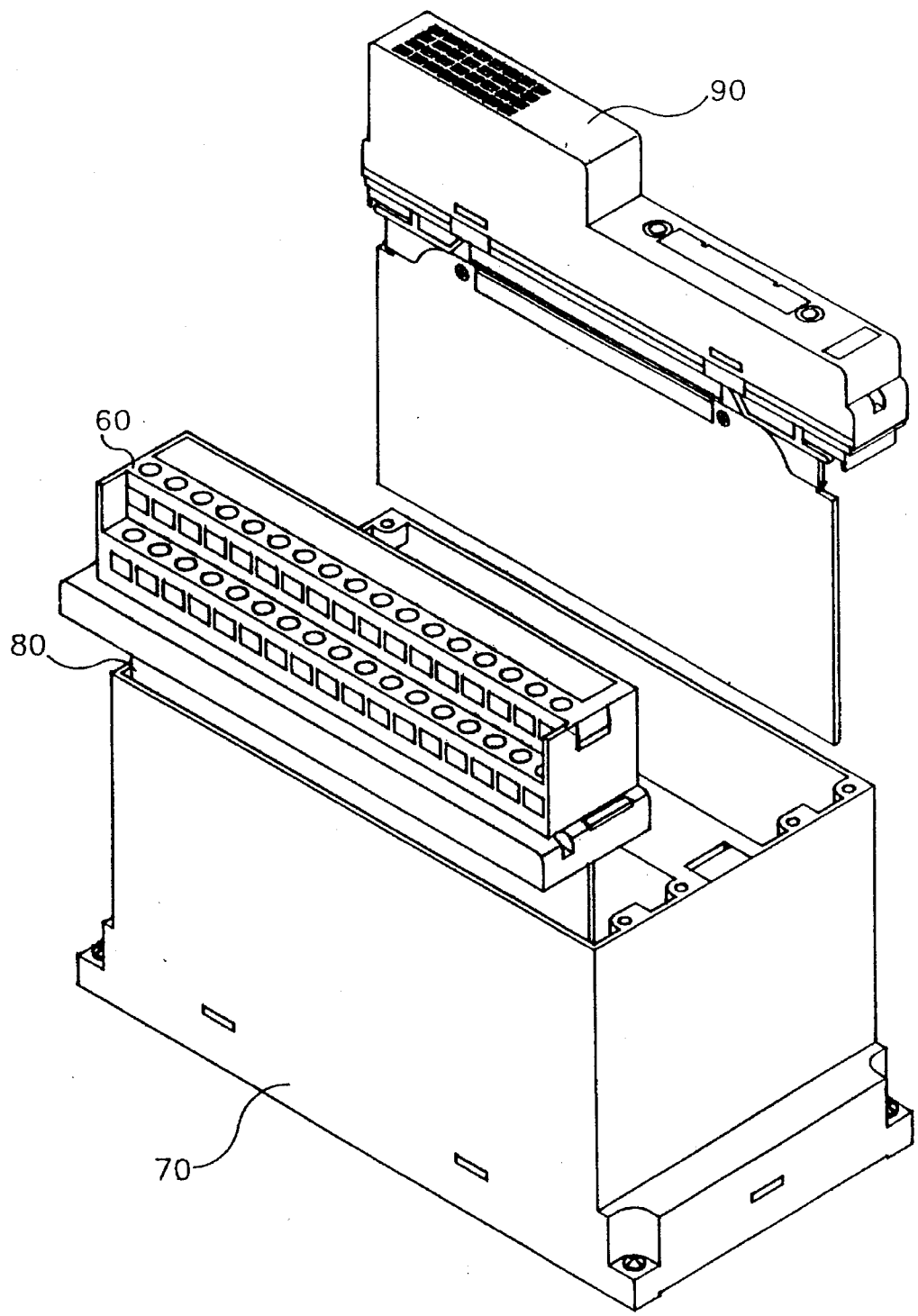
FIG. 8 is a view depicting a second embodiment of the invention

A second embodiment will now be described with reference to FIG. 8. An input-output nest 70 has contained therein two chambers which each accommodate two input-output printed circuit boards 80. The nest 70 can be made of aluminum when good heat dissipation is desired, such as discussed above for case part 30, or can be made of plastic when heat dissipation is not a consideration. Input-output printed circuit boards 80 have circuits which convert signals used on the control side and signals used on the field device side. For reasons related to increase of signal transfer speed, parallel signals are used in the bus, and, in order to keep the number of cores to a minimum, serial signals in the case of digital signals or analog signals are used in the signal wires. The circuit boards 80 perform conversion of the signals. An interface section 90 has signal wires connected to the field device side and transmits and receives the signals to and from board 80. The interface section 90 is of the connector type for use with multiple core cables, and has indicators for indicating the state of the signals in the circuit board 80. A terminal block 60, like the interface section 90, can have signal wires connected to the field device side, and is used for transmitting and receiving signals to and from circuit board 80. The terminal block 60 is used when the signal wires are separate individual wires.

Figure 9:
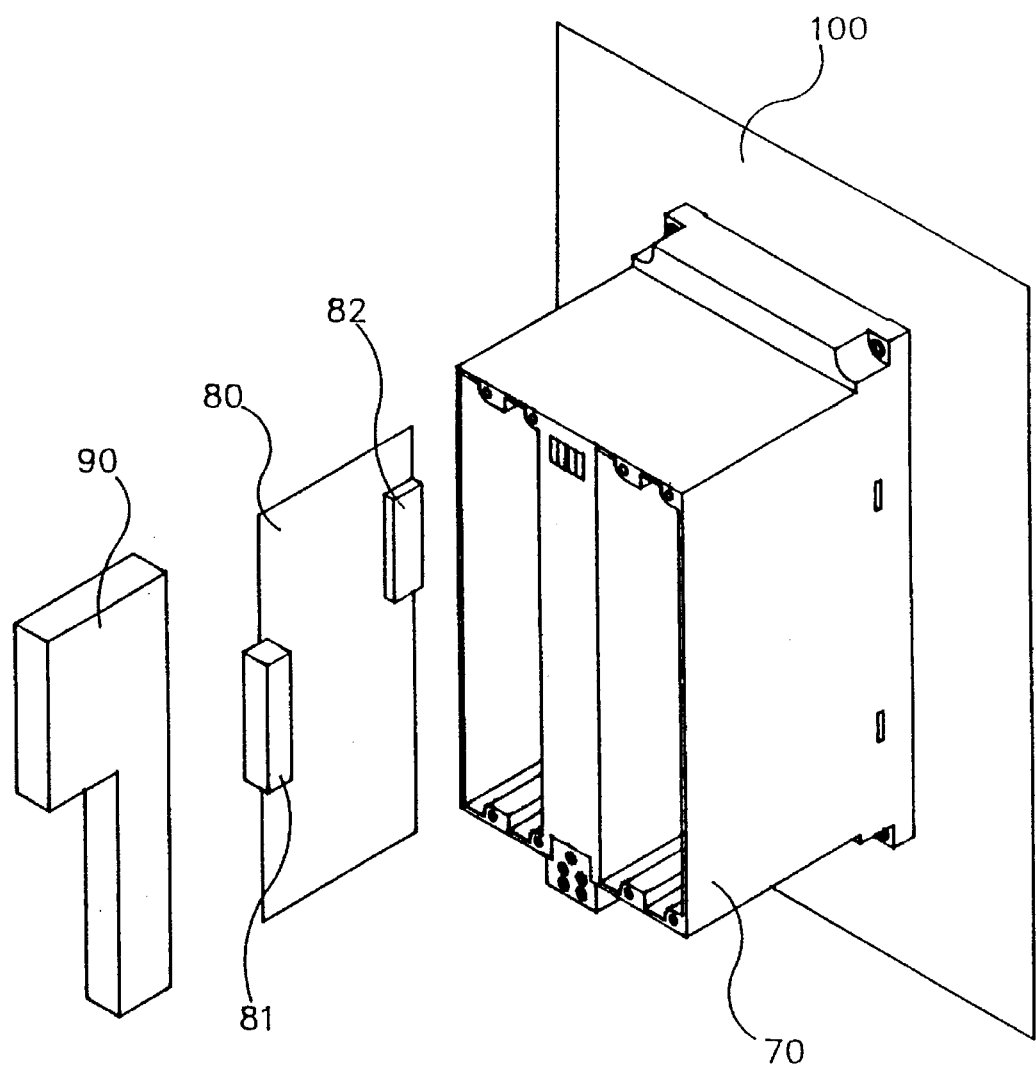
FIG. 9 is a view depicting a connector type interface section fitted to an input-output nest.

FIG. 9 shows a connector type interface section 90 fitted to an input-output nest. In FIG. 9, parts which perform the same function as the parts in FIG. 8 have been given the same reference numerals and description thereof is omitted hereat. In FIG. 9, a back unit 100 is a plate member which is accommodated in a cabinet or a console, and is provided with a bus which is connected to the central control device. In input-output nest 70, printed circuit boards 80, which are fitted to the back unit 100, are each provided with a front connector 81 for connection to the interface section 90 or a terminal block 60 and a rear connector 82 for connection to input-output nest 70.

Figure 10B:
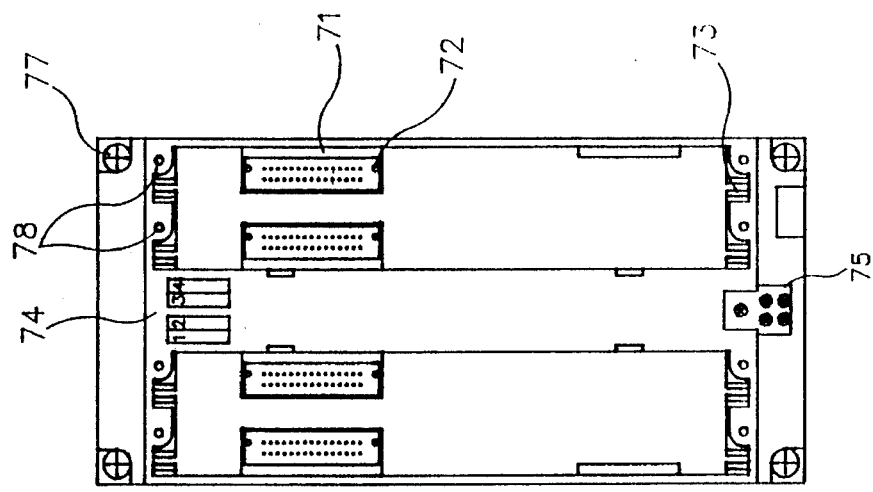
FIGS. 10(A) and 10(B) are views depicting an input-output nest.
Figure 10A:
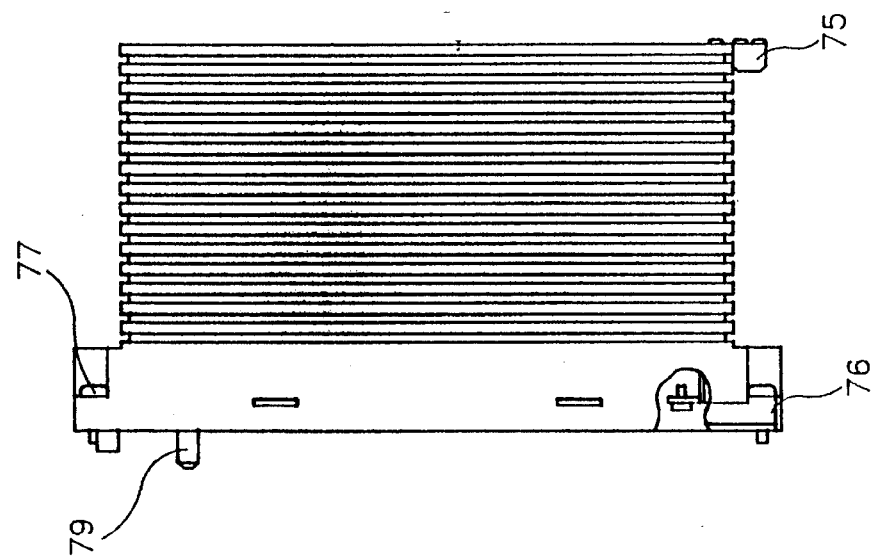

FIGS. 10(A) and 10(B) show details of input-output nest 70, wherein FIG. 10(A) is a side elevational view and FIG. 10(B) is a front elevational view. A back board 71 is mounted at the back of input-output nest 70, and connectors 72, used for connection to boards 80, are mounted on back board 71. Card guide portions 73 guide circuit boards 80 in the insertion direction and ensure the connection of connectors 72 to rear connectors 82. The card guide portions 73 are also called slots. A wiring work area 74 is provided in the central portion of the front of nest 70. Because the chambers which accommodate printed circuit boards 80 are located on each side of area 74, the wiring work area 74 is also a wall separating these two chambers.

An earth part 75 is a group of terminals mounted at the bottom of wiring work area 74, and terminals for grounding the printed circuit boards 80 with respect to the box type body, are mounted hereat. A metal fitting 76 provides grounding when the input-output nest is fitted to back unit 100. Mounting screws 77 are used to mount input-output nest 70 on back unit 100. In this example, a mounting screw 77 is provided at each of the four corners of nest 70. Interface fitting portions 78 are provided near card guide portions 73, and are fitting holes for fitting interfaces 90 to the slots. Projecting portions 79 are rod-shaped projections mounted on the back face of nest 70, and engage with concave portions provided in back unit 100 and facilitate positioning. In this embodiment, projecting portions 79 are provided in two places, a connector (not shown) is disposed between the projecting portions 79. The portions 79 guide the mating of the connector (not shown) with a connector on the back unit side. As a result, even when fitting has to be carried out in a confined space, or it is difficult to check from the side to see whether the connectors are properly mated, proper mating can be carried out and the installation is made easier and reliability is improved. When interface section 90 is a terminal block, wiring work area 74 is used as a working space in which to connect the signal wires. Thus, even when terminal blocks are mounted over both of the chambers, wiring can be carried out smoothly.

The just described device is assembled in the following manner. The amount of heat produced by input-output printed circuit board 80 varies, depending on the type of signals handled and the signal conversion method. Input-output nest 70 is provided with slit-shaped openings (not numbered) for heat dissipation, and is designed so that for up to a certain amount of generated heat, the increase in the interior temperature remains at a tolerable level. According to the amount of heat generated by circuit board 80, and the components mounted thereon, although each chamber is capable of accommodating two boards, one circuit board may be accommodated in each chamber, or altogether only one board may be accommodated in the two chambers.

Because interface section 90 is fixed to interface fitting portions 78, and connection to circuit board 80 accommodated in the slot is made thereby, the connecting operation can be carried out smoothly. Also, the width of interface section 90 can be one slot width or two slot width, or in some cases may be made wider, and occupy the entire wiring work area 74. Because this kind of wide interface section 90 is allowed, there is a high degree of flexibility in the design of the device.

According to the second embodiment, because an industrial control equipment input-output unit is constructed from three modules, and these modules can be combined in a manner according to the requirements of the system, there are the benefits that the system can be built with a standardized nest form, expansion and alterations can be made easily, and cost reductions can be readily obtained by use of mass production techniques. The three modules are the general input-output nest 70, the input-output printed circuit board 80 which performs signal conversion, and the interface 90 or terminal block 60.

Terminal Block 60

Figure 11A:
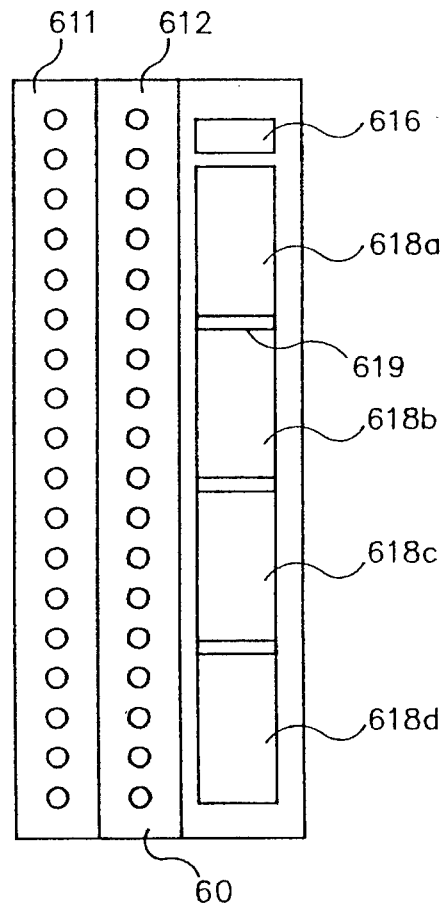
FIGS. 11(A) and 11(B) are views depicting a terminal block 60.
Figure 11B:
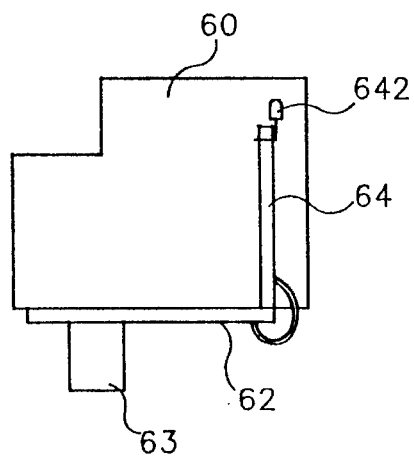

The terminal block 60 used in the second embodiment will now be described further with reference to FIGS. 11(A) and 11(B), wherein FIG. 11(A) is an upper surface view, and FIG. 11(B) is a side elevational view. Terminal block 60 may be made of an insulating material, such as plastic, and is provided with a lower terminal row 611 and an upper terminal row 612, each row having 17 terminals. A ready indicator chamber 616 and a circuit board accommodating chamber 618 divided into four chambers are disposed in a row parallel to the lower terminal row 611 and upper terminal row 612, and the chambers of circuit board chamber 618 are separated from each other by circuit board guides 619. A back board 62 is mounted on the bottom of terminal block 60, and has a wiring pattern which is connected to the terminals. A connector 63 is mounted on the bottom of back board 62, and sends the signals from the signal wires connected to the terminals out through a connector (not shown) connected to the outside device. An indicator circuit board 64 is accommodated in circuit board accommodating chamber 618, and in this embodiment, light emitting devices 642 are shown mounted on indicator circuit board 64. When other expansion functions, such as temperature compensation units, are to be provided, other optional circuit boards are fitted.

Figure 12B:
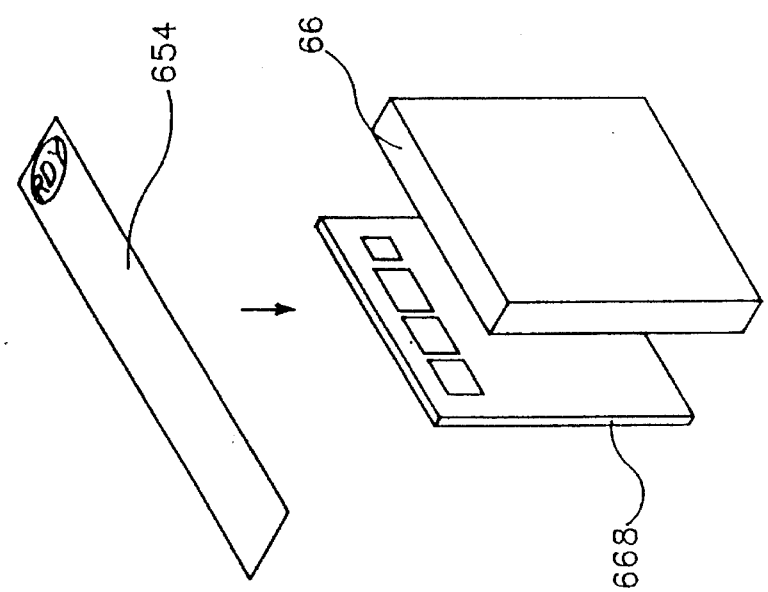
FIGS. 12(A) and 12(B) are views depicting an expansion function which is mounted in a circuit board accommodating chamber.
Figure 12A:
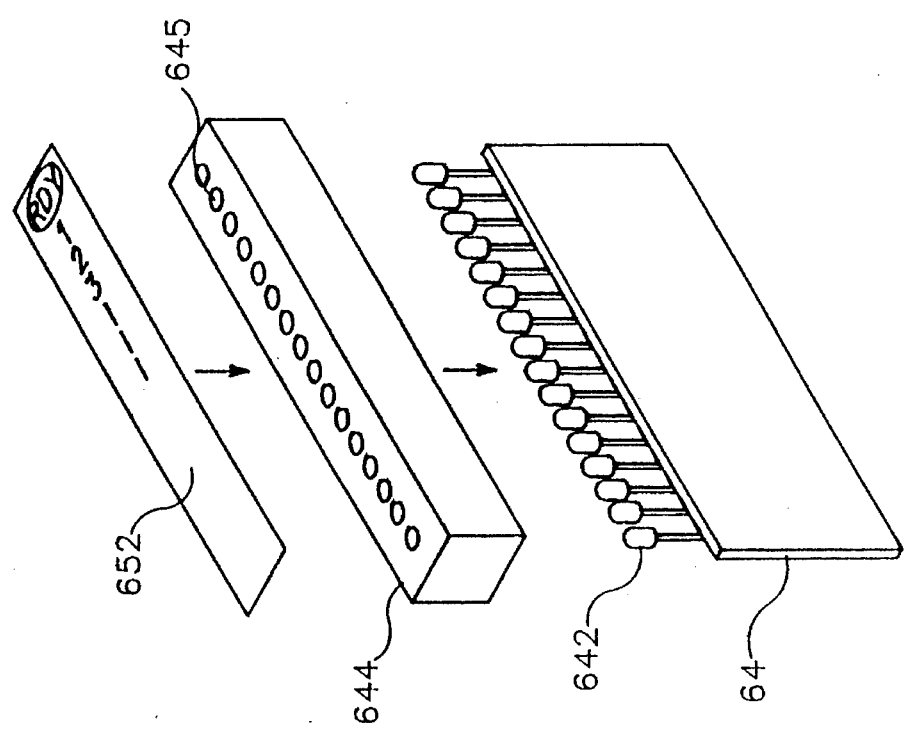

FIGS. 12(A) and 12(B) show the expansion functions to be fitted into the circuit board accommodating chamber, wherein FIG. 12(A) shows the case of an indicator function, and FIG. 12(B) shows the case of a temperature compensation unit. In the case of the indicator function, i.e. FIG. 12(A), an indicator circuit board 64 is used. Indicator circuit board 64 has light emitting devices 642 mounted thereon in four groups corresponding to the chamber 618 which is divided into four chambers, and spaces corresponding to the circuit board guides 619 are provided between the groups of light emitting devices. Guides 619 also perform the function of confining the indicator circuit board 64 to its prescribed position. A partitioned light guide part 644 is a member formed of an opaque plastic. The guide part 644 is mounted on the upper surface of circuit board guide 619, and accommodates light emitting devices 642 in light guide holes 645. An indicator sheet 652 is affixed to the upper surface of partitioned light guide part 644 and indicates the terminal numbers corresponding to light emitting devices 642 which are turned ON and OFF in light guide holes 645.

As shown in FIG. 12(B), temperature compensation unit 66 makes contact with the terminals and measures their temperature, and is needed when accurate temperatures are to be measured with thermocouple In this embodiment, because it is accommodated in the chambers of the circuit board accommodating chamber 618, one unit is provided for four terminals. For this kind of temperature compensation unit 66, for example, the unit disclosed in Japan laid open Um H5-36329 is suitable. A cover sheet 668 is fitted onto the surface of the terminal side of temperature compensation unit 66. Windows are pushed against the terminals. A ready sheet 654 is affixed to the upper surface of temperature compensation unit 66. Ready sheet 654 serves as the indicator in the ready indicator chamber 616, and there is no particular indication on the circuit board accommodation chambers 618 portion.

Figure 13:
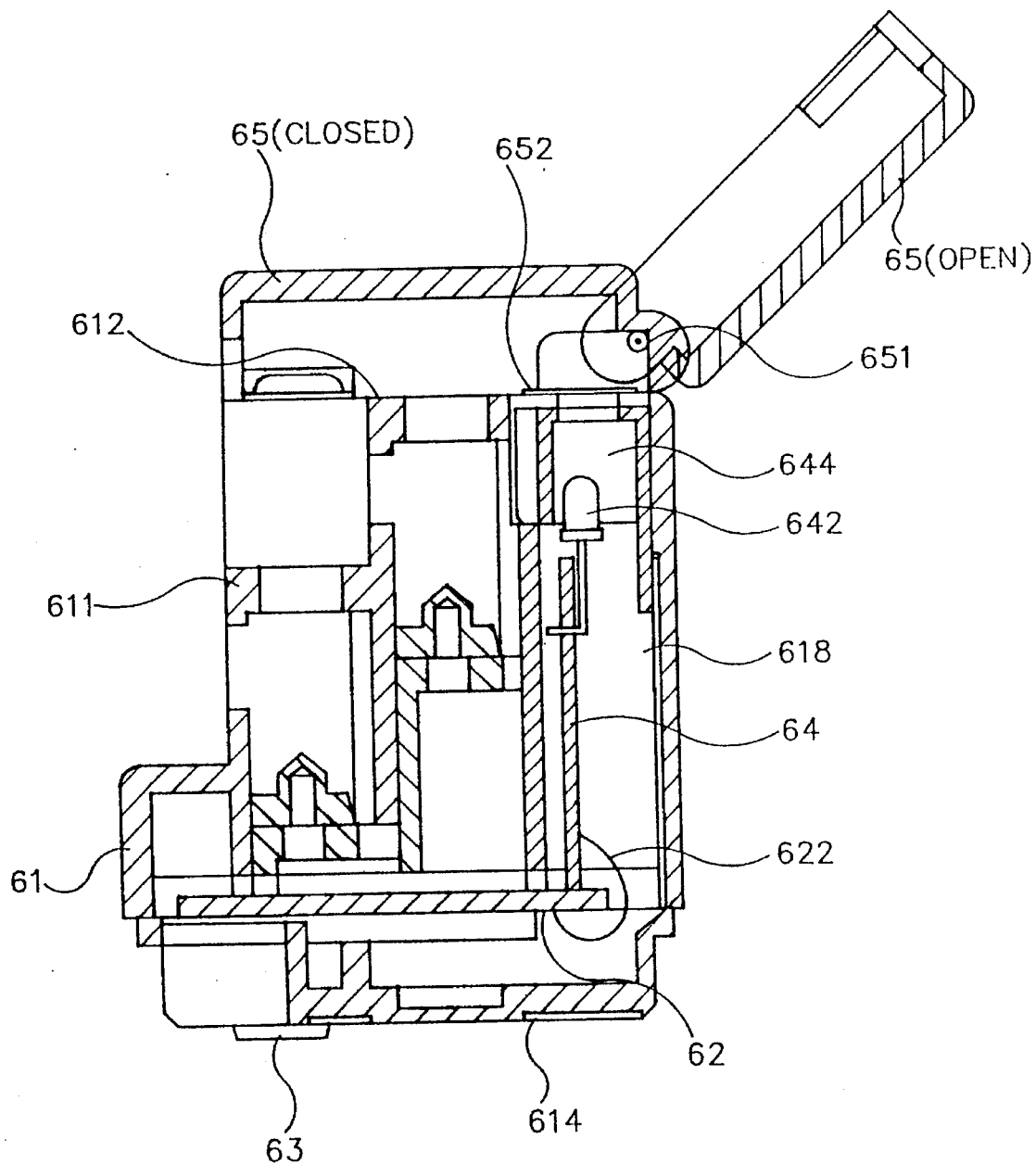
FIG. 13 is a cross-sectional view depicting a terminal block having an indicating function.

FIG. 13 shows a terminal block which has an indicator function. The terminal construction in the chambers of the lower terminal row 611 and upper terminal row 612 are omitted from this view. Terminals having mechanism which prevent screws from falling, such as disclosed in Japan Laid Open UM H4-102568, are suitable. A main body 61 is the main structural member of terminal block 60, and is made of plastic. A back plate 614 covers a back board 62, and is fitted to the bottom surface of terminal block 60.

A connecting cable 622 connects back board 62 to indicator circuit board 64, and supplies signals for controlling the illumination of light emitting devices 642 from the back board 62 side. The light emitting devices are bent in the end surface direction of the indicator circuit board 64 and are received by partitioned light guide part 644. A cover 65 is opened and closed about a hinge part 6 mounted on terminal block 60. When cover 65 is opened, signal line connecting operation on the terminals can be performed easily. When cover 65 is closed, indicator sheet 652 is positioned above partitioned light guide part 644 and the operator can easily discern which of the terminals it is whose state is being indicated by light emitting device 642.

Figure 14:
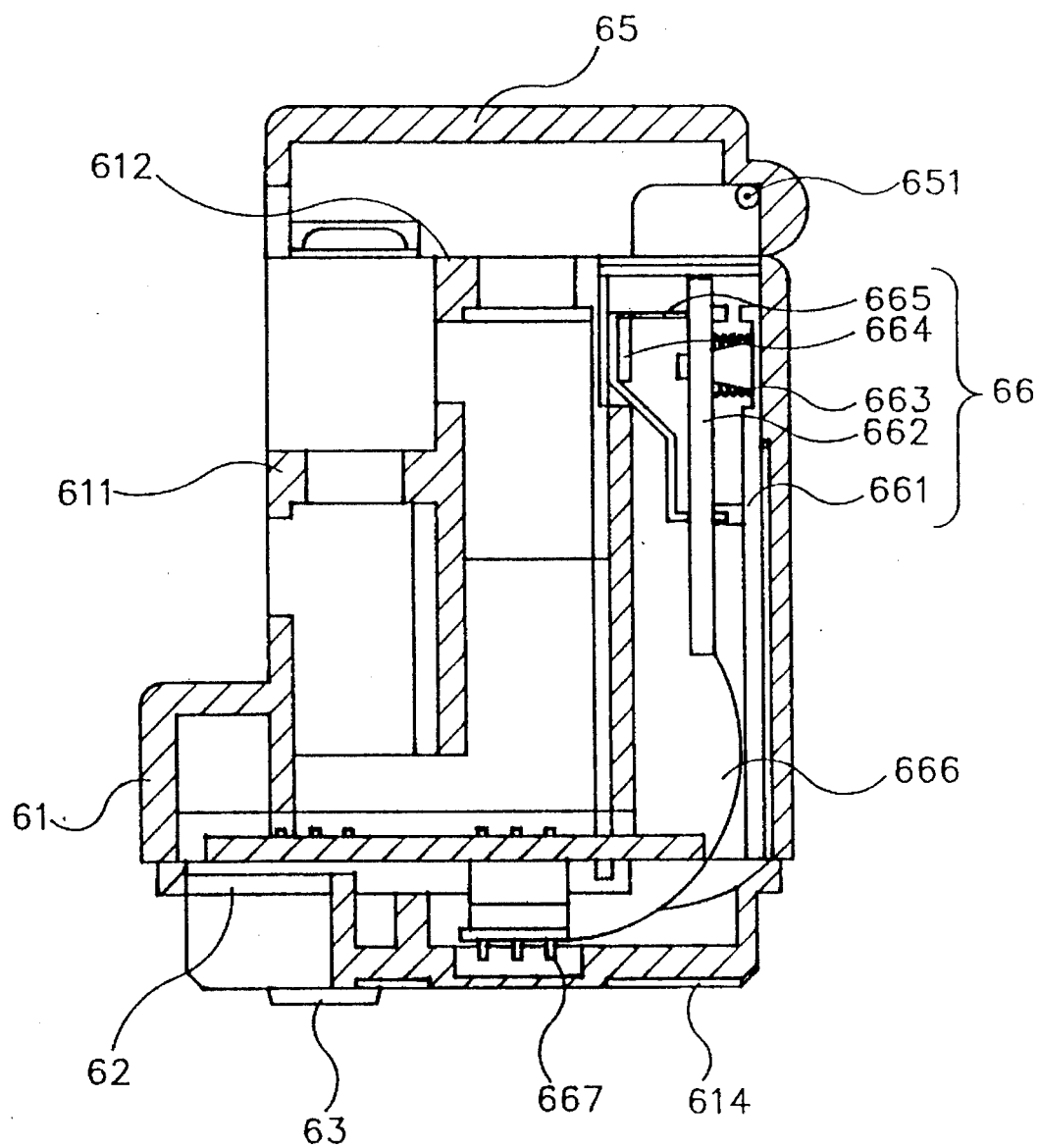
FIG. 14 is a cross-sectional view depicting a terminal block having a temperature compensation unit 66.

FIG. 14 shows a temperature compensation unit 66 comprising a case portion 661 of an external shape suitable for insertion into circuit board accommodation chamber 618 and a printed circuit board 662 which is accommodated therein. A spring 663 is mounted between case portion 661 nad printed circuit board 662. By pushing printed circuit board 662 to the terminal side, spring 663 causes the temperature sensors 664 to make contact with the terminals. A metal holding fitting 665 has its entire surface fixed to printed circuit board 662, and temperature sensors 664 are mounted integrally therewith. A cable 666 carries the measurement signal produced by temperature sensor 664 to back board 62 through a compensation connector 667 after it has been converted into an electronic signal by printed circuit board 662. In this example, by using a flexi-cable for cable 666, the connection of the signal wires is carried out smoothly. Since thermocouple temperature compensation is well known, details thereof are omitted hereat.

Figure 15:
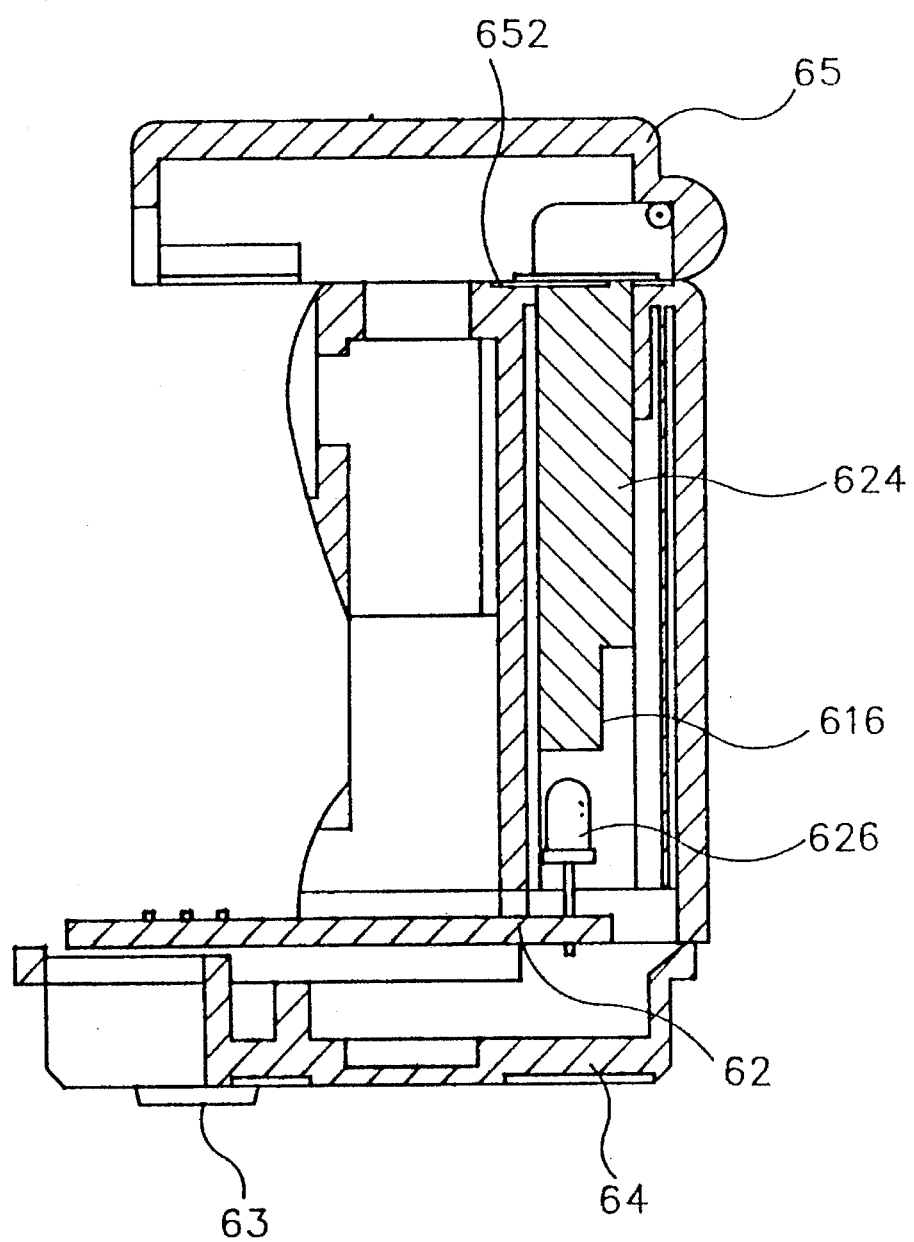
FIG. 15 is a cross-sectional view depicting details of a ready display chamber 616.

FIG. 15 shows details of ready indicator chamber 616. A light emitting device 626 is mounted at the edge of back board 62, and the operating state of terminal block 60 is indicated by light emitting device 626. A light guide 624 is accommodated in ready indicator chamber 616. Light guide 624 guides light emitted by light emitting device 626 to the RDY of indicator sheet 652. This function is an essential function of the terminal block, and is provided commonly for all types of terminal blocks.

Figure 16C:
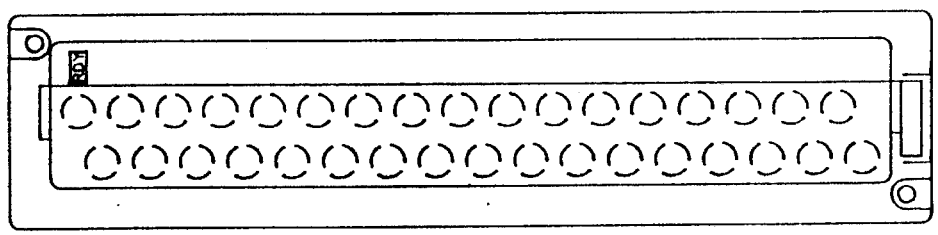
FIGS. 16(A), 16(B) and 16(C) are upper surface views depicting the state of a display sheet affixed to a cover 65.
Figure 16B:
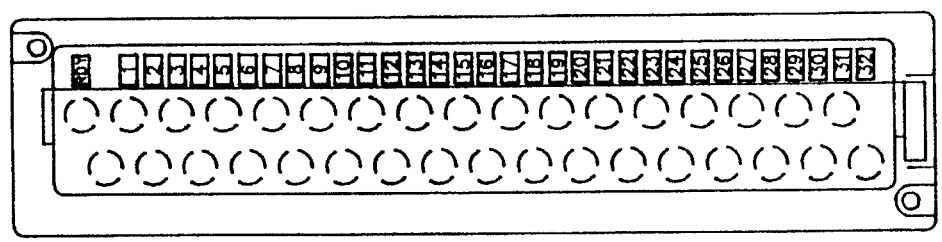
Figure 16A:
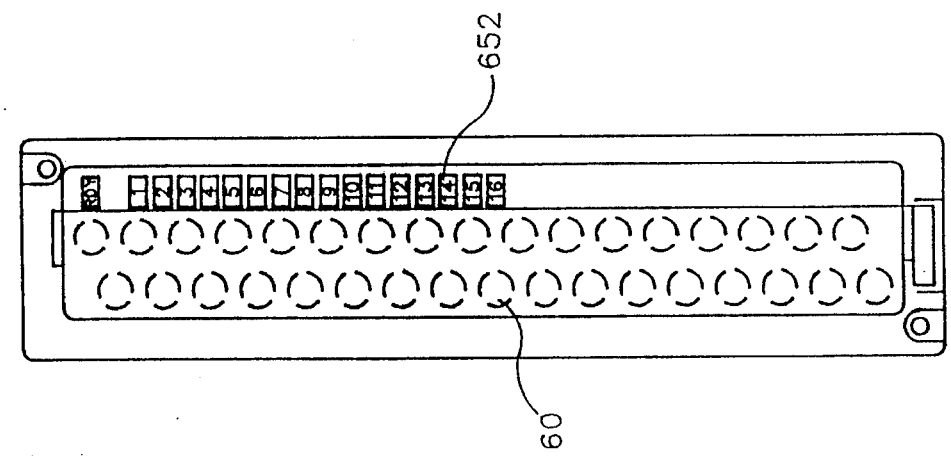

FIGS. 16(A), 16(B) and 16(C) show the terminal block main body with the indicator sheet affixed thereto, wherein FIG. 16(A) shows a sixteen contact point indicator, FIG. 16(B) shows a thirty two point indicator, and FIG. 16(C) shows an indicator for the ready signal only. When the indicator function has sixteen points, the corresponding terminals of lower terminal row 611 and upper terminal row 612 are used as sets of one plus terminal and one minus terminal. Accordingly, the contact point signal indication is also performed using the signals of the terminal sets. The ready signal RDY and the contact point terminal numbers 1–16 are indicated on indicator sheet 652. This makes it easy to visually confirm which of the terminals correspond to which of the light emitting devices 642 accommodated in the circuit board accommodation chamber 618.

When the indicator function has 32 points, independent signal wires are connected to the terminals of lower terminal row 611 and upper terminal row 612. Surplus terminals in lower terminal row 611 and upper terminal row 612 are used as the respective minus terminals Ready signal RDY and terminal numbers 1–32 of the contact points are indicated on marker sheet 652.

Ready sheet 654 is fixed on the terminal block 60 and shows only the ready signal RDY when the temperature compensation unit 66 is accommodated in chamber 618, and when the board 64 is not fitted. Because the ready signal RDY is necessary for all types of terminals, the operating state of the terminal block can be confirmed by the sheet.

According to the terminal block 60 described above, because the operating state of the terminal block is indicated by ready indicator 616, the operating state of the terminal block can be checked whatever the type of terminal. Accordingly, there is the benefit that the common use of terminal block 60 can be promoted and the number of molds required can be minimized. Also, because the indicator circuit board 64 and temperature compensation unit 66 and the like are provided or not provided on a case by case basis, according to the requirements of each type of terminal block, there is the benefit that optional functions can be matched to the signal line type with the use of only a small number of components.

Interface Section 90

The connector type interface section 90 used in the second embodiment will now be described with reference to FIG. 17. The case is shown with hatched lines. A printed circuit board 91 has electronic devices and connectors, etc, mounted thereon, and is roughly L-shaped. An indicator circuit board 92 is provided with light emitting devices, such as LEDs, disposed in a matrix form, and makes a T-shape in its positional relationship with printed circuit board 91. Printed circuit board 91 is accommodated in case 93 in the side surface direction, and indicator circuit board 92 is accommodated behind an indicator window 931 mounted at the front of case 93. A cover 94 is fitted to the back of case 93 and holds both printed circuit board 91 and indicator circuit board 92 in case 93. A box type body for electronic apparatus, such as the input-output nest shown in FIG. 8, is fitted to case 93, and an input-output printed circuit board 80 for signal processing is also connected to case 93 via a connector 911. Also, it is desirable that an indicator window cover 95, made of transparent plastic or the like, be fitted over the indicator window 931.

FIG. 18 shows an enlarged view of the vicinity of indicator window 931. Holding projection 937, which position indicator circuit board 92, and indicator board abutting portions 939, which abut the indicator window 931 side edge of indictor circuit board 92, are provided on the back of indicator window 931.

The indicator circuit board abutting portions 939 are line form projections mounted in the widthways direction of indicator window 931.

FIGS. 19(A) and 19(B) show the various parts of the interface section 90 with cover 94 removed. Windows corresponding to light emitting devices are formed in a four row by eight column matrix in the indicator window 931. When desired, name plates may be attached indicating the object of the indicator and LEDs may be used indicting the current flow or non-flow state. An indicator circuit board accommodating chamber 932 is located behind the indicator window 931 and accommodates indicator circuit board 92. A printed circuit board accommodating chamber 933 occupies most of case 93 and accommodates printed circuit board 91. Engaging holes 934 are engaged by case mounting claws 941 mounted on the cover 94. In this embodiment, the holes 934 consist of rectangular windows formed in two places on each side of case 93. Cover guide projecting portions 935 are for facilitating the mating of case 93 and cover 94, and thin portions which are thinner than the rest of cover 94 are formed in corresponding positions on the cover 94 side. Case guide projections can be provided on the cover 94 side also, and thin portions can be formed on the case 93 side. Nest mounting portions 936 are screw holes formed in the upper and lower ends of the surface of case 93 which abuts cover 94, and are used in fitting case 93 to a nest or a wall body or the like.

A connector 911 is mounted on the back of the printed circuit board 91, and this is connected to an input-output printed circuit board 80 for signal processing. A connector 912 is mounted on the front of printed circuit board 91, and is used to connect signal wire which are connected to outside devices. Signals inputted through connector 912 pass through connector 912 and input-output printed circuit board 80 and are used in connection with the bus that is on the nest side. Cable 922 is a multiple core flat cable which connect printed circuit board 91 and indicator circuit board 92 and carries the illuminating drive signals of indicator circuit board 92. Holding holes 921 are openings which are provided in two locations on the indicator circuit board 92 and engage with the holding projections 937. To allow for dimensional errors these holes are oblong in shape.

Figure 20A:
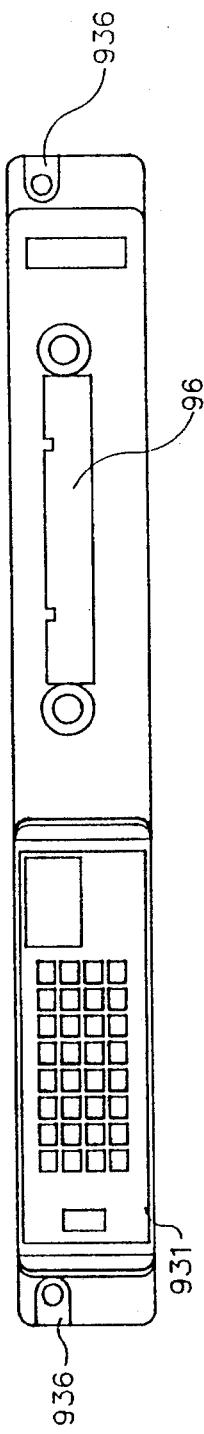
FIGS. 20(A), 20(B) and 20(C) are views depicting parts of case 93.
Figure 20B:
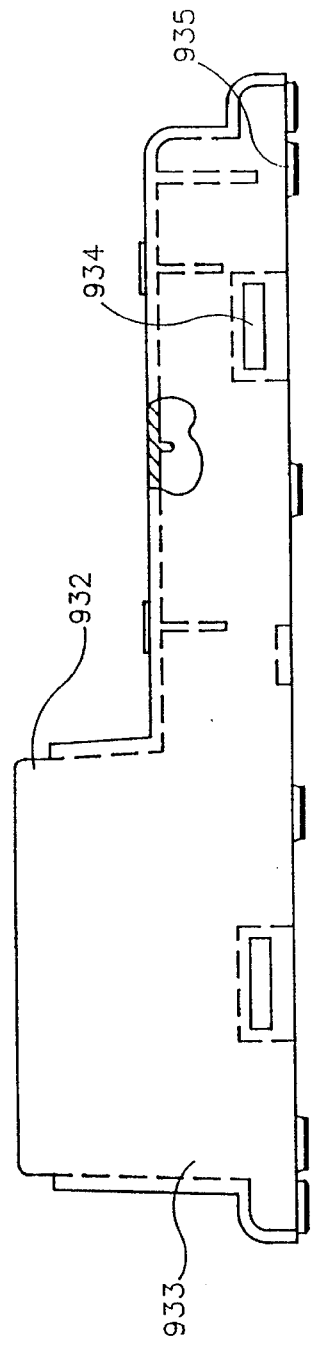
Figure 20C:
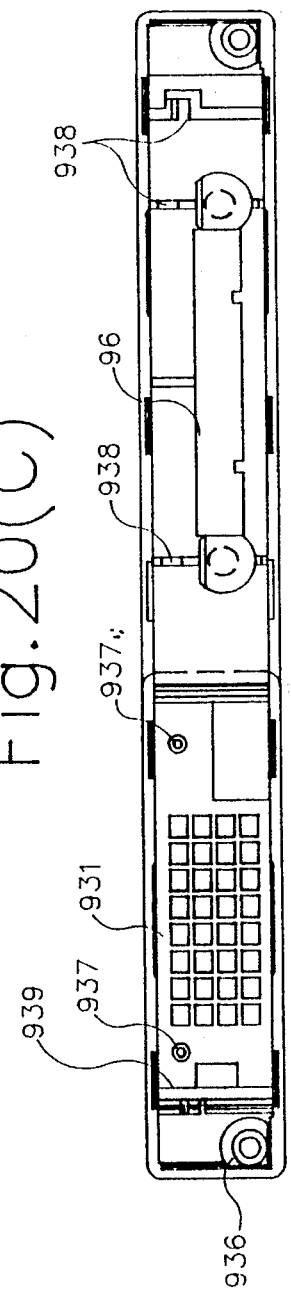

FIGS. 20(A), 20(B) and 20(C) show case 93, wherein FIG. 20(A) is a front elevational view, FIG. 20(B) is a side elevational view, and FIG. 20(C) is a back elevational view. A connector fitting hole 96 has a cable connected to connector 91 fitted to board 91 fitted thereto, and, in order to completely connect the two, screw holes are formed at both ends. Circuit board holding grooves 938 are portions cut out of ribs formed in the widthways direction of case 93 and position printed circuit board 91. Holding projections 937 are disposed in positions where they do not overlap with grooves 938. Cover 94 is also provided with a connecting mounting hole 96 for fitting the cable connected to connector 911 mounted on board 91.

The assembly of a device constructed in this manner will now be discussed. First, indicator circuit board 92 is fitted onto the back of indicator window 931 in such a manner that holding projection 937 on indicator window 931 engage with holding holes 921. Then, board 91 is inserted along grooves 938 and thereby accommodated in circuit board accommodation chamber 933. During this process, differences in position between board 92 and board 91 are absorbed by cable 922. Finally, when cover 94 is fitted to case 93, board 92 and board 91 are fixed together in the case, en bloc.

According to the embodiment, when cover 94 is fitted to case 93, indicator board 92 and board 91 are fixed in cse 93, en bloc, there is the benefit that assemblying can be carried out more smoothly than in conventional cases wherein display circuit board 92 and printed circuit board 91 are fixed to case 93 one by one. Also, because the space that conventionally has been necessary for this successive fixing is reduced, there is also the benefit that the density of components is increased.

The foregoing description is illustrative of the principles of the invention. Numerous extensions and modifications thereof would be apparent to the worker skilled in the art. All such extension and modifications are to be considered to be within the spirit and scope of the invention.

What is claimed is:

1. An input-output unit for communicating between an industrial control equipment and field devices controlled thereby, said unit comprising:
   a card accommodating chamber (10) connected to said industrial control equipment and provided with a row of slots (12) which receives input-output cards (50) which perform conversion between signals handled by the industrial control equipment and signals handle by the field devices, wherein each slot comprises an upper groove and a lower groove, and wherein each of said input-output cards is held by a corresponding pair of upper groove and lower groove;
   a terminal block (20), provided with at least two terminals per slot; said terminal to which respective signal wires connected to the field devices are connected and to which are respective connected said input-output cards; and
   a case (30) comprising a front face on which the card accommodating chamber is exposed and the terminal block is mounted with the terminals and slots mounted in direct correspondence.

2. The unit of claim 1, wherein the card accommodating chamber comprises: a back board (14), mounted at the back of the card accommodating chamber and connected by a bus to the industrial control equipment, and connectors (16), mounted on the back board of each slot, to which the input-output cards loaded into the slots, are connected, and wherein the terminal block has a terminal board (28) which is connected to the terminals of the terminal block and which is mounted on the case opposite the back board, and wherein the back board and the terminal board and signal wires for connecting the two are all integrally constructed of a printed circuit board (46) having a bendable rigidity.

3. An input-output unit for communicating between an industrial control equipment and field devices controlled thereby, said unit comprising:
   a card accommodating chamber connected to said industrial control equipment and provided with a row of slots which receives input-output cards which perform conversion between signals handled by the industrial control equpment and signals handled by the field devices;
   a terminal block, provided with at least two terminals per slot to which signal wires connected to the field devices are connected and to which are connected said input-output cards;
   a case comprising a front face on which the card accommodating chamber and terminal block are mounted in correspondence with the terminals and slots;
   a terminal cover, which covers the terminals, fitted to the terminal block;
   a slot indicating sheet, which, when the terminal cover is closed, indicates the numbers and tags of the slots of the card accommodating chamber; and
   a terminal indicating sheet, which, when the terminal cover is open, indicates the numbers and tags of the terminals.

4. An input-output unit for communicating between an industrial control equipment and field devices controlled thereby, said unit comprising:
   a card accommodating chamber connected to said industrial control equipment and provided with a row of slots which receives input-output cards which perform conversion between signals handled by the industrial control equipment and signals handled by the field devices;
   a terminal block, provided with at least two terminals per slot, to which signal wires connected to the field devices are connected and to which are connected said input-output cards; and
   a case comprising a front face on which the card accommodating chamber and terminal block are mounted in correspondence with the terminals and slots;
   wherein the input-output cards each comprises:
   a printed circuit board, on which electronic components are mounted;
   a case part, to which the printed circuit board is fitted in such a manner that the case part covers one side of the printed circuit board;
   a fan part, for air cooling, mounted on a front part of the case part;
   an ejector part, fitted to an end of the front of the case part, for ejecting the card from the card accommodating chamber; and
   a cover part, mounted on the case part in such a manner that the cover part covers the other side of the printed circuit board.

5. An input-output unit for communicating between an industrial control equipment and field devices controlled thereby, said unit comprising:
   an input-output nest, connected by a bus to the industrial control equipment;
   an input-output printed circuit board, which is accommodated in the input-output nest and converts signals handled by the industrial control equipment and signals handled by the field devices; and
   a terminal block, to which signal wires connected to the field devices are connected and which electrically connect these signal wires to the input-output printed circuit board;
   wherein a plurality of terminals to which signal wires are connected are disposed in rows in the terminal block, and the terminal block has a back board, mounted on the bottom surface of the terminal block, which has a pattern which is connected to the terminals;
   wherein the terminal block has a ready indicator chamber and a circuit board accommodating chamber disposed in the row direction in which the terminals are disposed;
   wherein a light emitting device is mounted on the back board and emits light for indicating the operating state of the terminal block, said light being guided through the ready indicator chamber to the upper surface of the terminal block;
   wherein an indicator circuit board on which light emitting device, which are turned ON and OFF according to the signal states of the terminals, is accommodated in the circuit board accommodating chamber; and
   wherein a partitioned light guide which is on the upper surface of the terminal block and which, in the direction in which the terminal are lined up separately, displays the light emitted by each of the light emitting device, which is mounted in the circuit board accommodating chamber.

6. An input-output unit for communicating between an industrial control equipment and field devices controlled thereby, said unit comprising:

an input-output nest, connected by a bus to the industrial control equipment;

an input-output printed circuit board, which is accommodated in the input-output nest and converts signals handled by the industrial control equipment and signals handled by the field devices; and a terminal block, to which signal wires connected to the field devices are connected and which electrically connect these signal wires to the input-output printed circuit board;

wherein a plurality of terminals to which signal wires are connected are disposed in rows and in the terminal block, and the terminal block has a back board, mounted on the bottom surface of the terminal block, which as a pattern which is connected to the terminals, wherein the terminal block has a ready indicator chamber and a circuit board accommodating chamber disposed in a row direction in which the terminals are disposed;

wherein a light emitting device is mounted on the back board and emits a light for indicating the operating state of the terminal block, said light being guided through the ready indicator chamber to the upper surface of the terminal block; and wherein a temperature compensation unit, which makes thermal contact with a terminal to which a thermocouple is connected and measures the temperature thereof, is mounted in the circuit board accommodating chamber.

7. An input-output unit for communicating between an industrial control equipment and field devices controlled thereby, said unit comprising:

an input-output nest, connected by a bus to the industrial control equipment;

an input-output printed circuit board, which is accommodated in the input-output nest and converts signals handled by the industrial control equipment and signals handled by the field devices; and an interface section, to which signal wires to the field devices are connected and which electrically connect these signal wires to the input-output printed circuit board;

wherein the interface section comprises:

a printed circuit board, an indicator circuit board which has light emitting device mounted thereon and which is connected to the printed circuit board through a cable, a case whose side surface is larger than the printed circuit board and which accommodates the indicator circuit board behind an indicator window provided in a front of the case, and a cover which is fitted to a back of the case; and wherein the indicator circuit board is provided with holding holes and wherein the indicator window is provided with holding projections which project from a back surface of a display window and engage the holding holes and the indicator circuit board is held by the holding projections and an edge portion of the printed circuit board.

\* \* \* \* \*